(12) United States Patent
Wan et al.

(10) Patent No.: US 7,170,788 B1
(45) Date of Patent: Jan. 30, 2007

(54) LAST-FIRST MODE AND APPARATUS FOR PROGRAMMING OF NON-VOLATILE MEMORY WITH REDUCED PROGRAM DISTURB

(75) Inventors: Jun Wan, Sunnyvale, CA (US); Jeffrey W. Lutze, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/223,273

(22) Filed: Sep. 9, 2005

(51) Int. Cl.
*G11C 11/34* (2006.01)
*G11C 16/06* (2006.01)

(52) U.S. Cl. .................. 365/185.18; 365/185.14; 365/185.17; 365/195

(58) Field of Classification Search ......... 365/185.18, 365/185.14, 185.17, 195
See application file for complete search history.

(56) References Cited

U.S. PATENT DOCUMENTS

| | | | |
|---|---|---|---|
| 5,715,194 A | 2/1998 | Hu | |
| 5,862,074 A * | 1/1999 | Park ................ | 365/185.03 |
| 6,061,270 A | 5/2000 | Choi | |
| 6,175,522 B1 * | 1/2001 | Fang ................ | 365/185.18 |
| 6,181,599 B1 | 1/2001 | Gongwer | |
| 6,469,933 B2 | 10/2002 | Choi et al. | |
| 6,542,407 B1 | 4/2003 | Chen et al. | |
| 6,657,891 B1 | 12/2003 | Shibata et al. | |
| 6,781,877 B2 | 8/2004 | Cernea et al. | |
| 6,807,095 B2 | 10/2004 | Chen et al. | |
| 6,853,598 B2 | 2/2005 | Chevallier | |
| 6,859,397 B2 | 2/2005 | Lutze et al. | |
| 6,888,752 B2 | 5/2005 | Mangan et al. | |
| 6,888,758 B1 | 5/2005 | Hemink et al. | |
| 6,906,958 B2 | 6/2005 | Chih et al. | |
| 6,975,537 B2 * | 12/2005 | Lutze et al. ........ | 365/185.18 |
| 7,020,017 B2 * | 3/2006 | Chen et al. ........ | 365/185.03 |
| 2002/0003722 A1 | 1/2002 | Kanda et al. | |
| 2002/0051403 A1 | 5/2002 | Sim | |
| 2003/0161182 A1 | 8/2003 | Li et al. | |
| 2004/0060031 A1 | 3/2004 | Cernea | |
| 2005/0146933 A1 | 7/2005 | Guterman et al. | |
| 2005/0226055 A1 | 10/2005 | Guterman | |

* cited by examiner

*Primary Examiner*—Anh Phung
*Assistant Examiner*—Toan Le
(74) *Attorney, Agent, or Firm*—Vierra Magen Marcus & DeNiro LLP

(57) ABSTRACT

A non-volatile memory is programmed in a manner which reduces the incidence of program disturb for inhibited memory elements which undergo boosting to reduce program disturb, but which experience reduced boosting benefits due to their word line location. To achieve this result, a word line sequence in which the memory elements are programmed is adjusted so that higher word lines are programmed first, out of sequence relative to the remaining word lines. Additionally, self-boosting can be used for the higher word lines, while erased area self-boosting or a variant can be used for the remaining word lines. Furthermore, pre-charging of the channel of the inhibited memory elements may be employed prior to the self boosting, for the non-volatile storage elements which are programmed after those associated with the first word line.

36 Claims, 15 Drawing Sheets

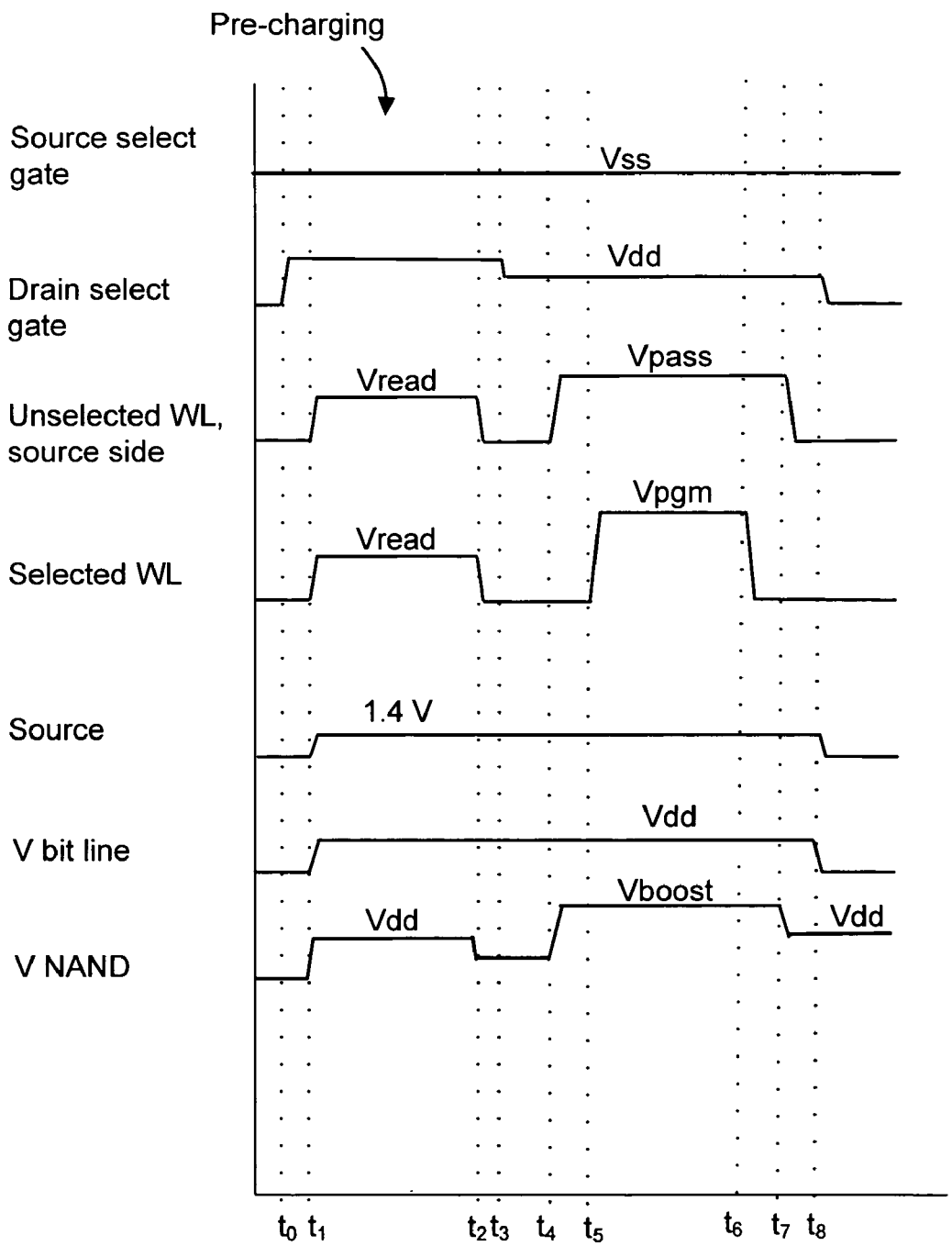

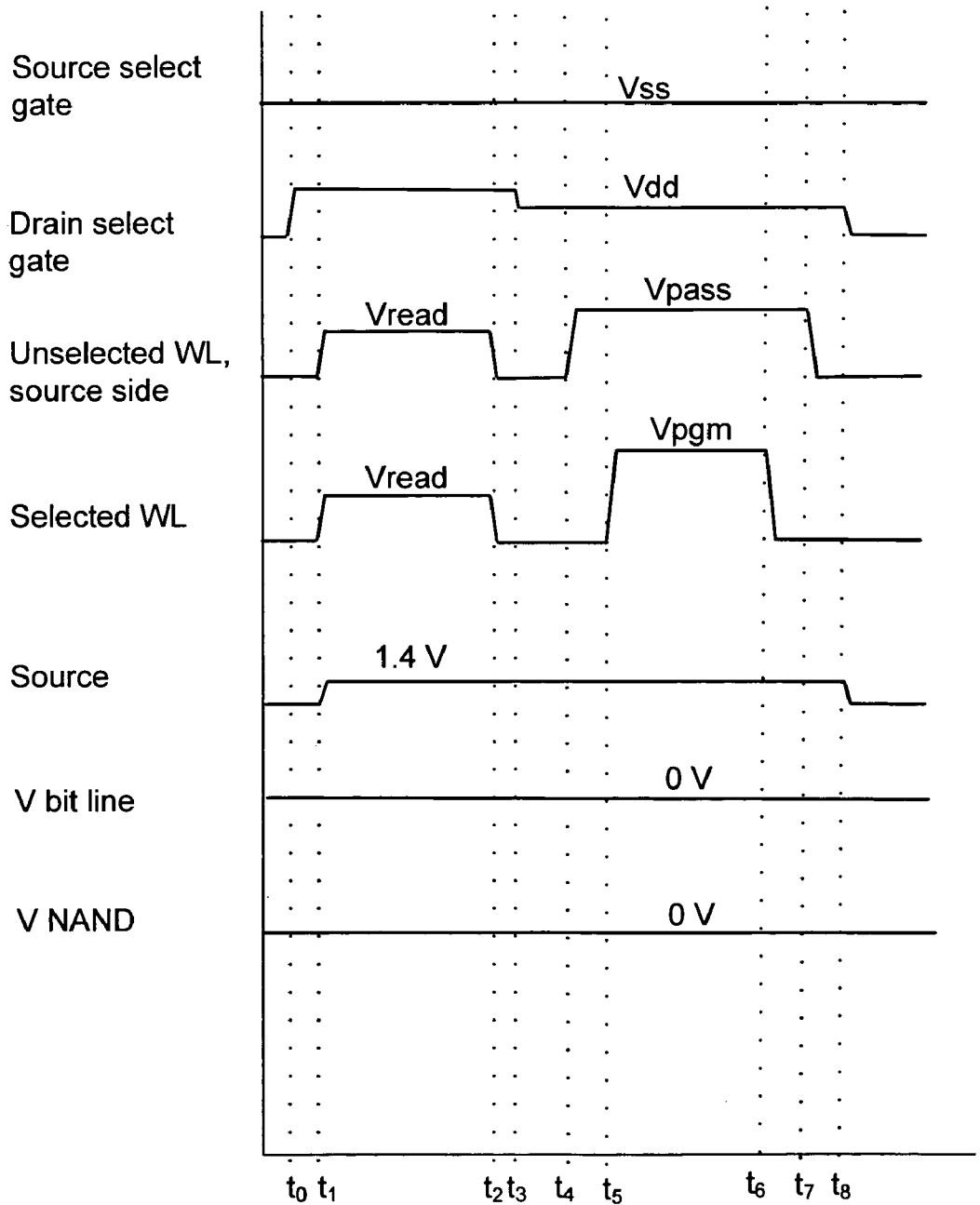

LAST-FIRST MODE AND APPARATUS FOR PROGRAMMING OF NON-VOLATILE MEMORY WITH REDUCED PROGRAM DISTURB

CROSS-REFERENCE TO RELATED APPLICATIONS

This application is related to co-pending, commonly assigned U.S. patent application Ser. No. 11/223,623, filed Sep. 9, 2005, titled "Last-First Mode and Method for Programming of Non-Volatile Memory With Reduced Program Disturb", by Jun Wan and Jeffrey W. Lutze, filed on the same date herewith, incorporated herein by reference in its entirety.

BACKGROUND OF THE INVENTION

1. Field of the Invention

The present invention relates to programming non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. In one possible approach, the magnitude of the pulses is increased with each successive pulse by a predetermined step size, e.g., 0.2–0.4 V. Vpgm can be applied to the control gates (or, in some cases, steering gates) of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," filed on Jul. 29, 2003; both of which are incorporated herein by reference in their entirety.

To apply Vpgm to the control gate of the memory element being programmed, Vpgm is applied on the appropriate word line. However, one memory element in each of the NAND strings uses the same word line and will therefore experience the program voltage. Unselected memory elements, which are not meant to be programmed, can be unintentionally programmed in a process referred to as "program disturb."

There is a need for a better mechanism to prevent program disturb.

SUMMARY OF THE INVENTION

An apparatus is provided for programming non-volatile memory elements in a manner that reduces the incidence of program disturb for inhibited memory elements. One embodiment addresses the high incidence of program disturb which is experienced by inhibited memory elements which undergo boosting of their channels to reduce program disturb, but which experience reduced boosting benefits due to their word line location. To achieve this result, a word line sequence in which the memory elements are programmed is adjusted. Additionally, the boosting techniques can be tailored to the word line position. Furthermore, the channel of the inhibited memory elements may be pre-charged so that, when programming memory elements on lower word lines, the bit line charge can be passed by previously-programmed memory elements on the higher word lines.

In one embodiment, an apparatus for programming non-volatile storage includes first and second subsets of non-volatile storage elements in a set of non-volatile storage elements. Word lines extend in a sequence from a first word line to a last word line, and include first and second subsets of word lines. One or more managing circuits are in communication with the first and second subsets of non-volatile storage elements via the first and second subsets of word lines, respectively. The one or more managing circuits receive a request to program data, and, responsive to the request, program the first subset of non-volatile storage elements using the first subset of word lines, and subsequently, program the second subset of non-volatile storage elements using the second subset of word lines. The first and second subsets of non-volatile storage elements are programmed in a predefined word line sequence that is out of sequence relative to the sequence in which the word lines extend. For example, programming may be carried out using one or more word lines at or near the bit line or drain side of the set, after which programming is carried out using a remainder of the word lines, starting at a common or source side of the set.

The one or more managing circuits may further store data which identifies the out of sequence word lines based on a determination of which non-volatile storage elements in the set are expected to experience a defined level of fail bits if the non-volatile storage elements in the set were to be programmed in a word line order which is in the sequence in which the word lines extend.

Additionally, non-volatile storage elements which are programmed by the out of sequence word lines can be inhibited using a first inhibit mode, such as self-boosting, to reduce program disturb, while non-volatile storage elements which are programmed by the remaining word lines can be inhibited using a second inhibit mode, such as erased area self boosting or revised erased area self boosting, to reduce program disturb. Pre-charging of the channel of the inhibited non-volatile storage elements may also be performed prior to the self boosting, for the non-volatile storage elements which are programmed after those associated with the first word line.

BRIEF DESCRIPTION OF THE DRAWINGS

FIG. 18 depicts a time line showing voltage waveforms for an inhibited NAND string, where pre-charging is used.

FIG. 19 depicts a time line showing voltage waveforms for a programmed NAND string.

DETAILED DESCRIPTION

Figure 1:
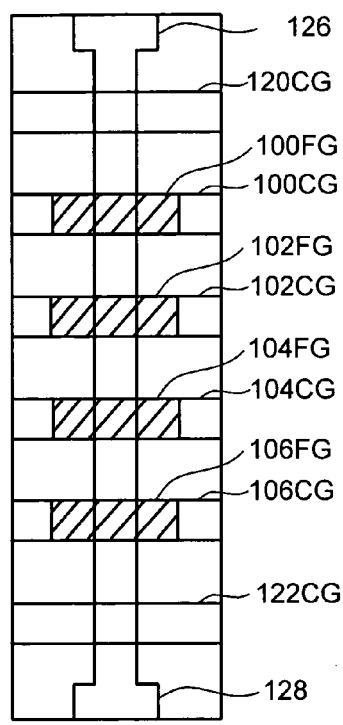
FIG. 1 is a top view of a NAND string.
Figure 2:
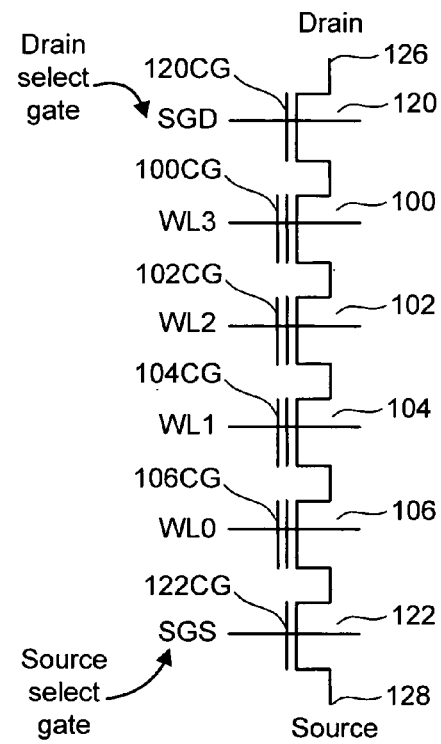
FIG. 2 is an equivalent circuit diagram of the NAND string of FIG. 1.

One example of a non-volatile memory system suitable for implementing the present invention uses the NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory cells or elements. In other designs, the memory elements may include multiple transistors or may be different than those depicted in FIGS. 1 and 2. Select gate 120 is connected to drain select line SGD, while select gate 122 is connected to source select line SGS.

Figure 3:
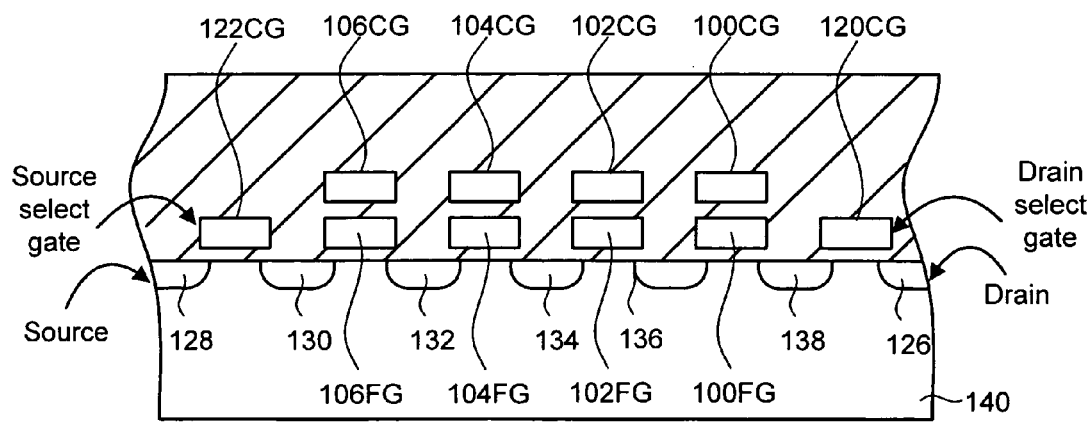
FIG. 3 is a cross-sectional view of the NAND string of FIG. 1.

FIG. 3 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1–3 show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Each memory element can store data represented in analog or digital form. When storing one bit of digital data, the range of possible threshold voltages of the memory element is divided into two ranges, which are assigned logical data "1" and "0." In one example of a NAND-type flash memory, the voltage threshold is negative after the memory element is erased, in what may be defined as the logic "1" state. The threshold voltage is positive after a program operation, in what may be defined as the logic "0" state. When the threshold voltage is negative and a read is attempted by applying 0 V to the control gate, the memory element will turn on to indicate logic one is being stored. When the threshold voltage is positive and a read operation is attempted by applying 0 V to the control gate, the memory element will not turn on, which indicates that logic zero is stored.

A memory element can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory element and the threshold voltage ranges of the element depends upon the data encoding scheme adopted for the memory elements. For example, U.S. Pat. No. 6,222,762 and U.S. patent application Ser. No. 10/461,244, "Tracking Cells For A Memory System," filed on Jun. 13, 2003, and published as U.S. Patent Application Publication 2004/0255090 on Dec. 16, 2004, both of which are incorporated herein by reference in their entirety, describe various data encoding schemes for multi-state flash memory elements.

Relevant examples of NAND-type flash memories and their operation are provided in U.S. Pat. Nos. 5,386,422, 5,570,315, 5,774,397, 6,046,935, 6,456,528 and 6,522,580, each of which is incorporated herein by reference in its entirety. Other types of non-volatile memory, in addition to NAND flash memory, can also be used with the present invention.

Another type of memory element useful in flash EEPROM systems is the charge trapping element, which utilizes a non-conductive dielectric material in place of a conductive floating gate to store charge in a non-volatile manner. Such an element is described in an article by Chan et al., "A True Single-Transistor Oxide-Nitride-Oxide EEPROM Device," IEEE Electron Device Letters, Vol. EDL-8, No. 3, March 1987, pp. 93–95. A triple layer dielectric formed of silicon oxide, silicon nitride and silicon oxide ("ONO") is sandwiched between a conductive control gate and a surface of a semi-conductive substrate above the memory element channel. The element is programmed by injecting electrons from the element channel into the nitride, where they are trapped and stored in a limited region. This stored charge then changes the threshold voltage of a portion of the channel of the element in a manner that is detectable. The element is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497–501, which describes a similar element in a split-gate configuration where a doped polysilicon gate extends over a portion of the memory element channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory elements described in this paragraph can also be used with the present invention. Thus, the technology described herein also applies to coupling between dielectric regions of different memory elements.

Another approach to storing two bits in each element has been described by Eitan et al., "NROM: A Novel Localized Trapping, 2-Bit Nonvolatile Memory Cell," IEEE Electron Device Letters, vol. 21, no. 11, November 2000, pp. 543–545, which describes an ONO dielectric layer that extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory elements described in this paragraph can also be used with the present invention.

Figure 4:
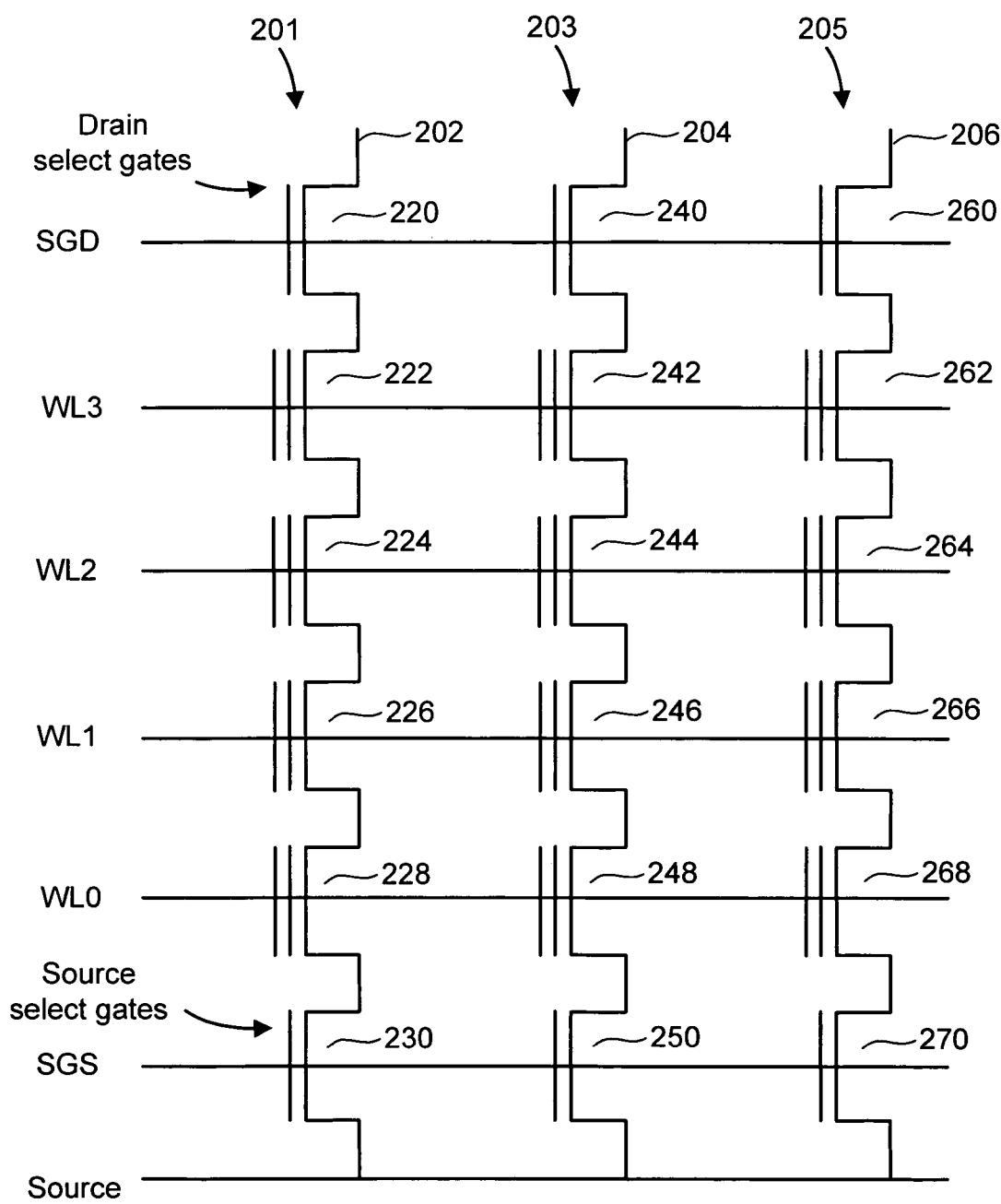
FIG. 4 is a circuit diagram depicting three NAND strings.

FIG. 4 is a circuit diagram depicting three NAND strings. A typical architecture for a flash memory system using a NAND structure will include several NAND strings. For example, three NAND strings 201, 203 and 205 are shown in a memory array having many more NAND strings. Each of the NAND strings includes two select transistors and four memory elements. For example, NAND string 201 includes select transistors 220 and 230, and memory elements 222, 224, 226 and 228. NAND string 203 includes select transistors 240 and 250, and memory elements 242, 244, 246 and 248. NAND string 205 includes select transistors 260 and 270, and memory elements 262, 264, 266 and 268. Each NAND string is connected to the source line by its select transistor (e.g., select transistor 230, 250 or 270). A selection line SGS is used to control the source side select gates. The various NAND strings 201, 203 and 205 are connected to respective bit lines 202, 204 and 206, by select transistors 220, 240, 260, etc., which are controlled by drain select line SGD. In other embodiments, the select lines do not necessarily need to be in common. Word line WL3 is connected to the control gates for memory element 222 and memory element 242. Word line WL2 is connected to the control gates for memory element 224 and memory element 244.

Word line WL1 is connected to the control gates for memory element 226 and memory element 246. Word line WL0 is connected to the control gates for memory element 228 and memory element 248. As can be seen, each bit line and the respective NAND string comprise the columns of the array or set of memory elements. The word lines (WL3, WL2, WL1 and WL0) comprise the rows of the array or set. Each word line connects the control gates of each memory element in the row. For example, word line WL2 is connected to the control gates for memory elements 224, 244 and 264.

Each memory element can store data (analog or digital). When storing one bit of digital data, the range of possible threshold voltages of the memory element is divided into two ranges which are assigned logical data "1" and "0." In one example of a NAND type flash memory, the voltage threshold is negative after the memory element is erased, and defined as logic "1." The threshold voltage after a program operation is positive and defined as logic "0." When the threshold voltage is negative and a read is attempted, the memory element will turn on to indicate logic one is being stored. When the threshold voltage is positive and a read operation is attempted, the memory element will not turn on, which indicates that logic zero is stored. A memory element can also store multiple levels of information, for example, multiple bits of digital data. In this case, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in U.S. Pat. Nos. 5,522,580, 5,570,315, 5,774,397, 6,046,935 and 6,456,528, each of which is incorporated herein by reference.

When programming a flash memory element, a program voltage is applied to the control gate of the element and the bit line associated with the element is grounded. Electrons from the channel are injected into the floating gate. When electrons accumulate in the floating gate, the floating gate becomes negatively charged and the threshold voltage of the element is raised. To apply the program voltage to the control gate of the element being programmed, that program voltage is applied on the appropriate word line. As discussed above, that word line is also connected to one element in each of the other NAND strings that share the same word line. For example, when programming element 224 of FIG. 4, the program voltage will also be applied to the control gate of element 244. A problem arises when it is desired to program one element on a word line without programming other elements connected to the same word line, for example, when it is desired to program element 224 but not element 244. Because the program voltage is applied to all elements connected to a word line, an unselected element (an element that is not to be programmed) on the word line, especially an element adjacent to the element selected for programming, may become inadvertently programmed, in the process referred to as program disturb. For example, when programming element 224, there is a concern that the adjacent element 244 might unintentionally be programmed.

Several techniques can be employed to prevent program disturb. In one method known as "self boosting," the unselected bit lines are electrically isolated and a pass voltage (e.g., 10 V) is applied to the unselected word lines during programming. The unselected word lines couple to the unselected bit lines, causing a voltage (e.g., 8 V) to exist in the channel of the unselected bit lines, which tends to reduce program disturb. Thus, self boosting causes a voltage boost to exist in the channel which tends to lower the voltage across the tunnel oxide and hence reduce program disturb.

A NAND string is typically (but not always) programmed from the source side to the drain side, for example, from memory element 228 to memory element 222. For example, assume the NAND string 203 is programmed before the NAND string 201. When the programming process is ready to program the last (or near the last) memory element of the NAND string 201, if all or most of the previously programmed memory elements on the NAND string being inhibited (e.g., NAND string 203) were programmed, then there is negative charge in the floating gates of the previously programmed memory elements. As a result, the boosting potential does not get high enough in portions of the NAND string 203 and there still may be program disturb on the elements in the NAND string 203 associated with the last few word lines. For example, when programming element 222 on NAND string 201, if elements 248, 246 and 244 on NAND string 203 were previously programmed, then each of those transistors (244, 246, 248) have a negative charge on their floating gate which will limit the boosting level of the self boosting process and possibly cause program disturb on element 242.

Local Self Boosting ("LSB") and Erased Area Self Boosting ("EASB") attempt to address the shortcomings of conventional self boosting by isolating the channel of previously programmed elements from the channel of the element being inhibited. For example, if element 224 of FIG. 4 is being programmed, LSB and EASB attempt to inhibit programming in element 244 by isolating the channel of element 244 from the previously programmed elements (246 and 248). With the LSB technique, the bit line for the element being programmed is at ground and the bit line of the NAND string with the element being inhibited is at Vdd. The program voltage Vpgm (e.g., 20 volts) is driven on the selected word line. The word lines neighboring the selected word line are at zero volts and the remaining non-selected word lines are at Vpass. For example, bit line 202 is at zero volts and bit line 204 is at Vdd. Drain select SGD is at Vdd and source select SGS is at zero volts. Selected word line WL2 (for programming element 224) is at Vpgm. Neighboring word lines WL1 and WL3 are at zero volts, and other word lines (e.g., WL0) are at Vpass.

EASB is similar to LSB with the exception that only the source side neighbor word line is at zero volts. The drain side neighbor word line is at Vpass. If Vpass is too low, boosting in the channel will be insufficient to prevent program disturb. If Vpass is too high, unselected word lines will be programmed. For example, WL1 would be at zero volts instead of Vpass, while WL3 would be at Vpass. In one embodiment, Vpass is 7–10 V.

While LSB and EASB provide an improvement over self boosting, they also present a problem that depends on whether the source side neighbor element (element 246 is the source side neighbor of element 244) is programmed or erased. If the source side neighbor element is programmed, then there is a negative charge on its floating gate. Moreover, with zero volts applied to the control gate, there is a highly reverse biased junction under the negatively charged gate which can cause Gate Induced Drain Leakage (GIDL), in which electrons leak into the boosted channel. GIDL occurs with a large bias in the junction and a low or negative gate voltage, which is precisely the case when the source side neighbor element is programmed and the drain junction is boosted. GIDL causes the boosted voltage to leak away prematurely, resulting in a programming error, and is more severe with the abruptly and highly doped junctions, which are required as element dimensions are scaled. If the leakage current is high enough, the boosting potential in the channel region will decrease possibly resulting in program disturb. Furthermore, the closer the word line being programmed is to the drain, the less charge is present in the boosted junction. Thus, the voltage in the boosted junction will drop quickly, causing program disturb.

If the source side neighbor memory element is erased, then there is positive charge on the floating gate and the threshold voltage of the transistor will likely be negative. The transistor may not turn off even when zero volts are applied to the word line. If the memory element is on, then the NAND string is not operating in EASB mode. Rather, that NAND string is operating in self boosting mode, which has the problems discussed above. This scenario is most likely if other source side elements are programmed, which limits source side boosting. This issue is most problematic with shorter channel lengths.

Figure 5:
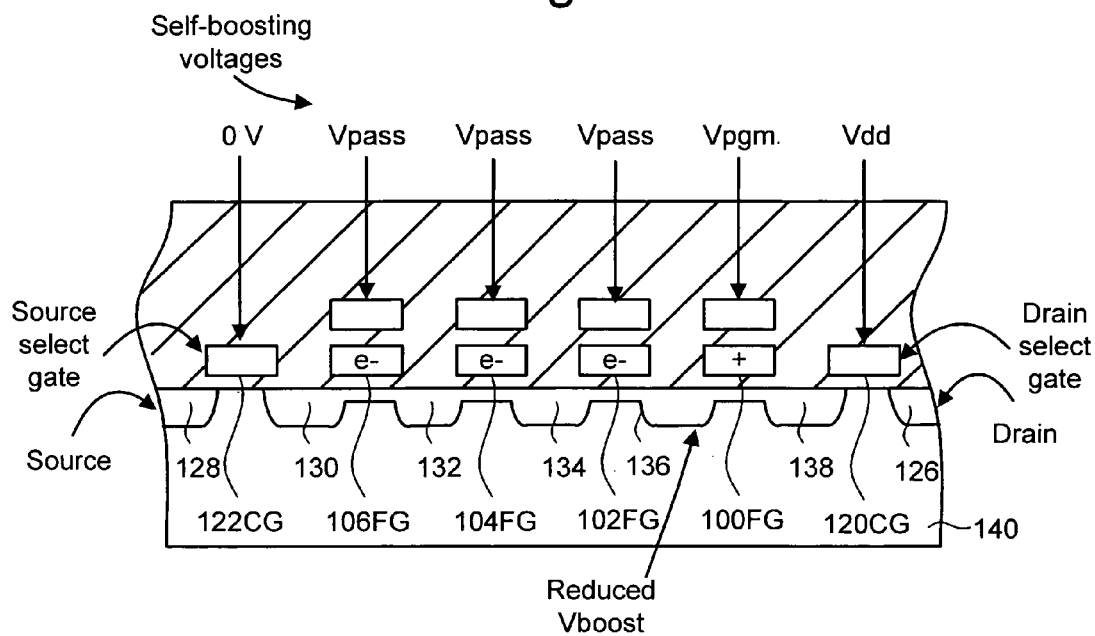
FIG. 5 is a cross-sectional view of the NAND string of FIG. 1, further depicting a word line dependence of channel boosting for unselected non-volatile storage elements, where self-boosting is used.

FIG. 5 is a cross-sectional view of the NAND string of FIG. 1, further depicting a word line dependence of channel boosting for unselected non-volatile storage elements, where self-boosting is used. In this example, the NAND string has previously been programmed such that negative charges (e-) have been programmed into floating gates 106FG, 104FG and 102FG. When a charge is to be programmed into a memory element in a selected NAND string which shares a word line with the memory element having the floating gate 100FG in the unselected NAND string, self-boosting is applied using the voltage Vpass to boost the voltage of the channel near the floating gate 100FG in the unselected NAND string. However, the negative charges on the floating gates 106FG, 104FG and 102FG will reduce the boosting potential Vboost such that a negative charge (−) can result in the floating gate 100FG due to the programming voltage Vpgm on the word line, resulting in program disturb. Vdd represents the voltage applied to the drain side control gate 120CG. This voltage is sufficient to allow the appropriate control gate to turn on, grounding the selected NAND string for programming, yet small enough to allow the appropriate control gate to remain off for isolating the unselected NAND string. The relationship between channel boosting potential and word line for self-boosting can be seen in FIG. 6.

Figure 6:
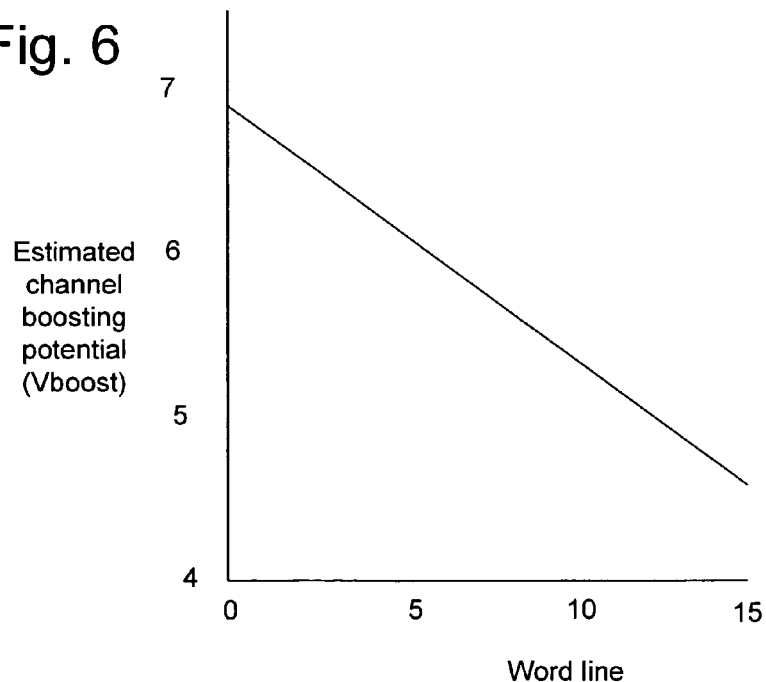
FIG. 6 is a graph showing a word line dependence of a channel boosting potential.

FIG. 6 is a graph depicting how channel boosting potential is reduced for higher word lines. As discussed previously, unselected memory elements, which are not meant to be programmed, but which are on the same word line as a memory element that is being programmed, will experience the program voltage and can be unintentionally programmed. To prevent this, self boosting is used to electrically isolate the unselected bit lines and to apply a pass voltage Vpass to the unselected word lines during programming, causing a voltage Vboost to exist in the channel of the unselected bit lines. However, for a given memory element on the unselected bit line, Vboost is attenuated by negative charges that exist on the floating gates of the previously programmed memory elements. The effect is cumulative so that Vboost is attenuated more for memory elements associated with higher word lines, which are programmed after the memory elements associated with the lower word lines. As a result, the boosting potential may not be high enough and there still may be program disturb on the last few word lines. The decrease in boosting potential is clearly evident for higher word lines. While the data presented is for a sixteen word line memory device, a similar trend is expected for devices with additional or fewer word lines.

Figure 7:
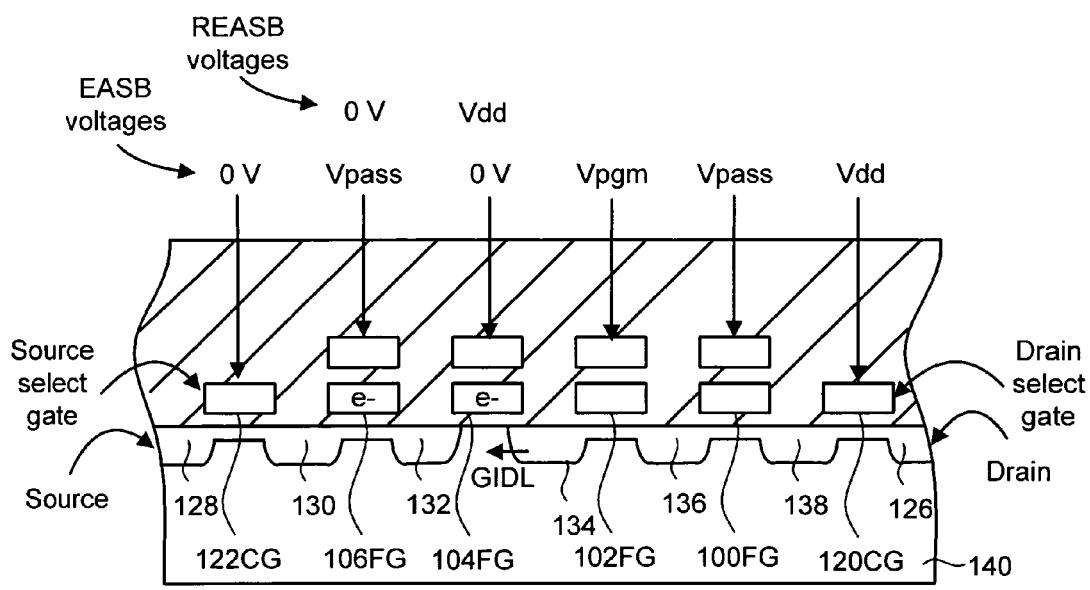
FIG. 7 is a cross-sectional view of the NAND string of FIG. 1, further depicting gate induced drain leakage for an unselected non-volatile storage element whose source side neighbor memory element is programmed, where erased area self-boosting is used.

FIG. 7 is a cross-sectional view of the NAND string of FIG. 1, further depicting GIDL for an unselected non-volatile storage element whose source side neighbor memory element is programmed, where erased area self-boosting (EASB) is used. In this example, the NAND string has previously been programmed such that negative charges (e-) have been programmed into floating gates 106FG and 104FG. When a charge is to be programmed into a memory element in a selected NAND string which shares a word line with the memory element having the floating gate 102FG in the unselected NAND string, conventional EASB is applied using the voltage Vpass to boost the voltage of the channel near the floating gate 102FG in the unselected NAND string. However, 0 V are applied to the neighboring source side word line, which is associated with the floating gate 104FG, to reduce coupling, as discussed previously. Since the source side neighbor element is programmed, there is a negative charge its floating gate 104FG. With 0 V applied to the control gate, there is a highly reverse biased junction under the negatively charged gate which can cause GIDL as shown by the arrow.

To address this, a revised EASB, REASB, can be provided by changing the voltage applied to the word line associated with floating gate 106FG from Vpass to 0 V, and by changing the voltage applied to the word line associated with floating gate 104FG from 0 V to Vdd. As mentioned, with regular EASB, if the source side neighbor is programmed and 0 V is applied, this can create GIDL, causing charge to be lost from the boosted junction region. Moreover, the closer the word line being programmed is to the drain, the less charge is present in the boosted junction since the capacitance is smaller. Thus, the voltage in the boosted junction will drop quickly, causing program disturb. With REASB, for example, assume WL4 is a lower word line that is currently used for programming. The REASB mode revises EASB by applying Vdd instead of 0 V to the next lower word line, WL3, and by applying 0 V instead of Vpass to the second next lower word line, WL2. Vpass is applied to WL1 and the remaining lower word lines. In both the regular and revised EASB modes, Vpass is applied to the next higher word line, WL5, and the remaining higher word lines.

The program disturb fail mode of REASB is similar to that of EASB in that, with either boosting mode, earlier programmed memory elements on an inhibited NAND string can reduce the channel boosting potential of later programmed memory elements on the NAND string, as discussed in connection with FIG. 6.

Figure 8:
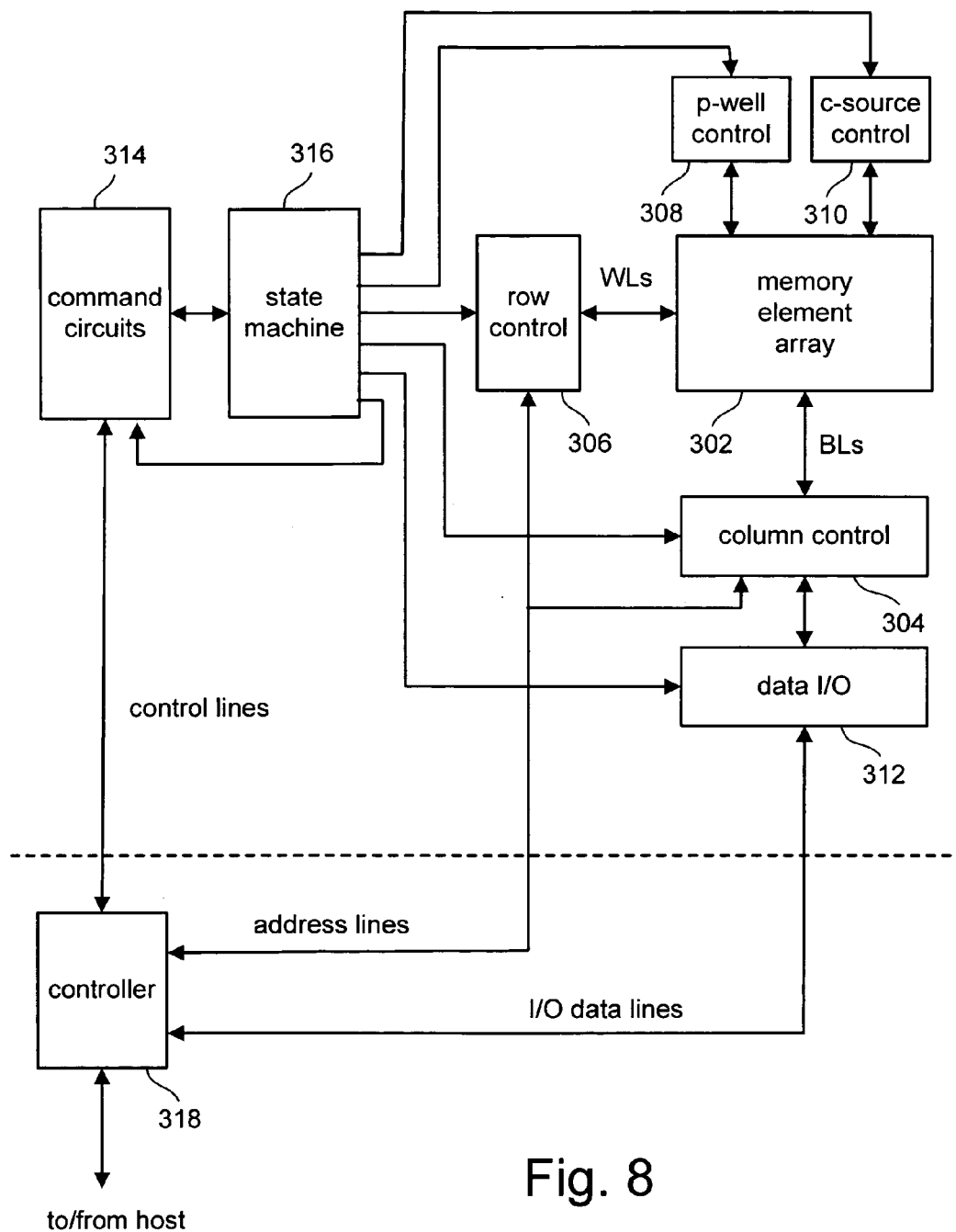
FIG. 8 is a block diagram of a non-volatile memory system.

FIG. 8 is a block diagram of one design of a flash memory system that can be used to implement the present invention. In this system, a memory element array 302 is controlled by a column control circuit 304, a row control circuit 306, a c-source control circuit 310 and a p-well control circuit 308. The column control circuit 304 is connected to the bit lines of memory element array 302 for reading data stored in the memory elements, for determining a state of the memory elements during a program operation, and for controlling potential levels of the bit lines (BLs) to promote or inhibit the programming. The row control circuit 306 is connected to the word lines to select one of the word lines, and to apply read, program and erase voltages. For example, program voltage levels used in EPROM and flash memory circuits are higher than the voltages normally used in memory circuits, and are often higher than the voltage supplied to the circuit.

These higher voltages can be produced by a charge pump in row control circuit 306 (or elsewhere), which in one example essentially dumps charge into the capacitive word line to charge it to a higher voltage. The charge pump receives an input at a voltage $V_{in}$ and provides an output at a higher voltage $V_{out}$ by boosting the input voltage progressively in a series of voltage multiplier stages. The voltage output is supplied to a load, for example, the word line of an EPROM memory circuit. In some implementations, there is a feedback signal from the load to the charge pump. The charge pump turns off in response to a signal indicating that the load has reached a predetermined voltage. Alternatively, a shunt is used to prevent overcharging once the load reaches the predetermined voltage. However, this consumes more power and is undesirable in low power applications. More information about charge pumps can be found in U.S. Pat. No. 6,734,718, incorporated herein by reference in its entirety.

The c-source control circuit 310 controls a common source line (labeled as "C-source" in FIG. 9) connected to the memory elements. The p-well control circuit 308 controls the p-well voltage.

The data stored in the memory elements is read out by the column control circuit 304 and output to external I/O lines via data input/output buffer 312. Program data to be stored in the memory elements is input to the data input/output buffer 312 via the external I/O lines, and transferred to the column control circuit 304. The external I/O lines are connected to a controller 318.

Command data for controlling the flash memory device is input to the controller 318. The command data informs the flash memory of what operation is requested. The input command is transferred to the state machine 316, which controls the column control circuit 304, the row control circuit 306, the c-source control 310, the p-well control circuit 308 and the data input/output buffer 312. The state machine 316 can also output status data of the flash memory such as READY/BUSY or PASS/FAIL. In some designs, state machine 316 is responsible for managing the programming process, including the processes depicted in the flow charts described below.

The controller 318 is connected or connectable with a host system such as a personal computer, a digital camera, personal digital assistant, etc. The controller 318 communicates with the host in order to receive commands and data from the host, and provide data and status information to the host. The controller 318 converts commands from the host into command signals that can be interpreted and executed by command circuits 314, which are in communication with the state machine 316. Controller 318 typically contains buffer memory for the user data being written to, or read from, the memory array. In some designs, the programming process can be managed by the controller.

One example memory system comprises one integrated circuit that includes controller 318, and one or more integrated circuit chips that each contains a memory array and associated control, input/output and state machine circuits. The trend is to integrate the memory arrays and controller circuits of a system together on one or more integrated circuit chips. The memory system may be embedded as part of the host system, or may be included in a memory card or other package that is removably inserted into the host systems. Such a removable card may include the entire memory system (e.g., including the controller) or just the memory array(s) and associated peripheral circuits, with the controller being embedded in the host. Thus, the controller or control capability can be embedded in the host or included within a removable memory system.

In some implementations, some of the components of FIG. 8 can be combined. In various designs, one or more of the components of FIG. 8, other than memory element array 302, can be thought of as a managing circuit. For example, one or more managing circuits may include any one of, or a combination of, a command circuit, a state machine, a row control circuit, a column control circuit, a well control circuit, a source control circuit or a data I/O circuit.

Figure 9:
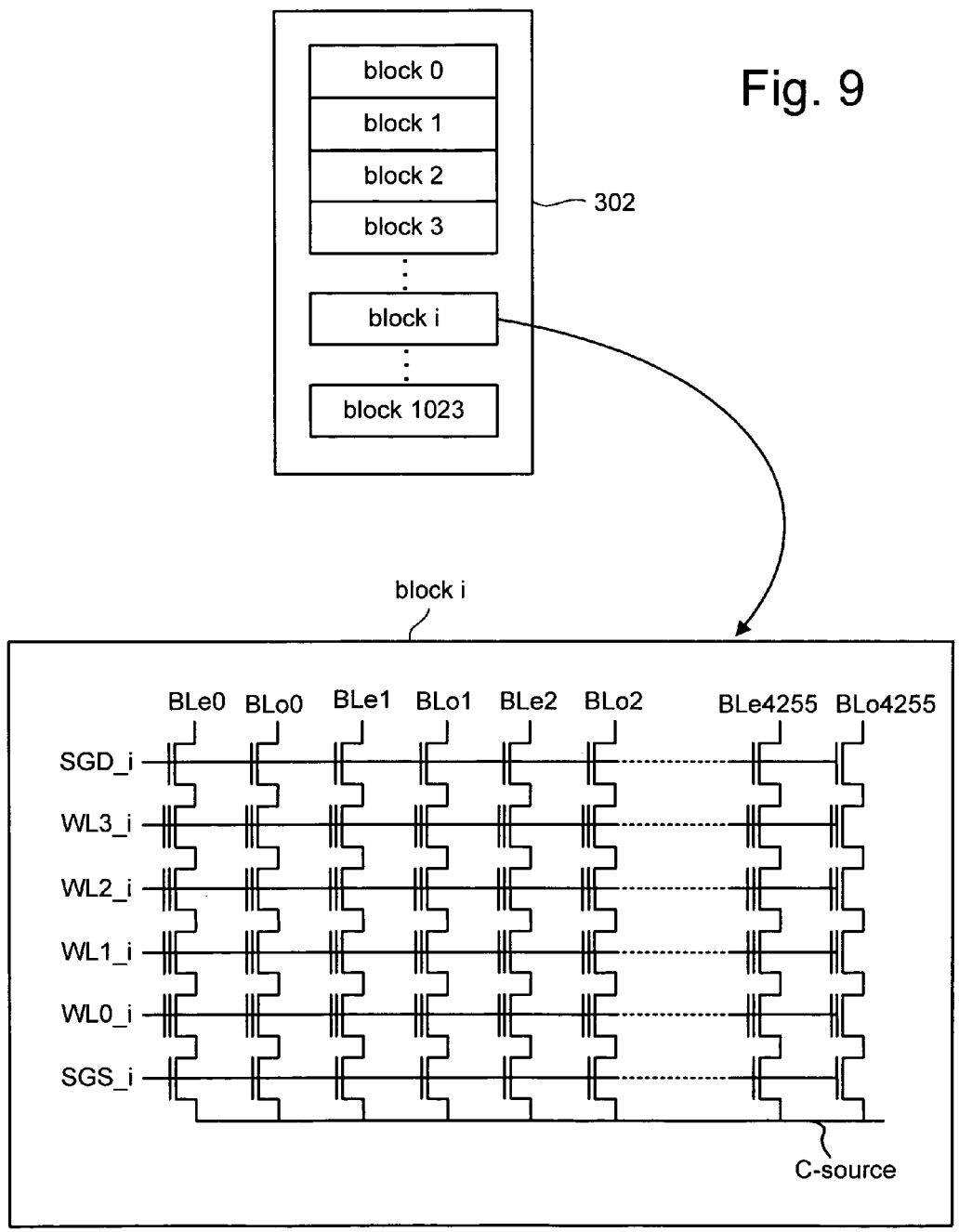
FIG. 9 is a block diagram of a non-volatile memory array.

FIG. 9 provides an example structure of memory element array 302. As one example, a NAND flash EEPROM is described that is partitioned into 1,024 blocks. In an erase operation, the data stored in each block is simultaneously erased. In one design, the block is the minimum unit of elements that are simultaneously erased. In each block, in this example, there are 8,512 columns that are divided into even columns and odd columns. The bit lines are also divided into even bit lines (BLe) and odd bit lines (BLo). FIG. 9 shows four memory elements connected in series to form a NAND string. Although four elements are shown to be included in each NAND string, more or less than four memory elements can be used. One terminal of the NAND string is connected to a corresponding bit line via a select transistor SGD, and another terminal is connected to the c-source line via a second select transistor SGS.

During one configuration of read and programming operations, 4,256 memory elements are simultaneously selected. The memory elements selected have the same word line and the same kind of bit line (e.g., even bit lines or odd bit lines). Therefore, 532 bytes of data, which form a logical page, can be read or programmed simultaneously, and one block of the memory can store at least eight logical pages (four word lines, each with odd and even pages). For multi-state memory elements, when each memory element stores two bits of data, where each of these two bits are stored in a different page, one block stores sixteen logical pages. Other sized blocks and pages can also be used with the present invention. Additionally, architectures other than those of FIGS. 8 and 9 can also be used to implement the present invention. For example, in one design, the bit lines are not divided into odd and even bit lines so that all bit lines can be programmed and read concurrently (or not concurrently).

Memory elements can be erased by raising the p-well to an erase voltage (e.g., 20 V) and grounding the word lines of a selected block. The source and bit lines are floating. Erasing can be performed on the entire memory array, separate blocks, or another unit of the memory elements which is a portion of the memory device. Electrons are transferred from the floating gate to the p-well region so that the threshold voltage becomes negative, in one possible approach.

In the read and verify operations, the select gates (SGD and SGS) and the unselected word lines (e.g., WL0, WL2 and WL3, when WL1 is the selected word line) are raised to a read pass voltage (e.g., 4.5 V) to make the transistors operate as pass gates. The selected word line WL1 is connected to a voltage, a level of which is specified for each read and verify operation in order to determine whether a threshold voltage of the concerned memory element is above or below such level. For example, in a read operation for a two-level memory element, the selected word line WL1 may be grounded, so that it is detected whether the threshold voltage is higher than 0 V. In a verify operation for a two level memory element, the selected word line WL1 is connected to 0.8 V, for example, so that it is verified whether or not the threshold voltage has reached at least 0.8 V. The source and p-well are at 0 V. The selected bit lines, assumed to be the even bit lines (BLe), are pre-charged to a level of, for example, 0.7 V. If the threshold voltage is higher than the read or verify level on the word line, the potential level of the bit line (BLe) associated with the element of interest maintains the high level because of the non-conductive memory element. On the other hand, if the threshold voltage is lower than the read or verify level, the potential level of the concerned bit line (BLe) decreases to a low level, for example, less than 0.5 V, because the conductive memory element discharges the bitline. The state of the memory element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of elements that are written at one time as a basic programming operation. One or more pages of data are typically stored in one row of memory elements. A page can store one or more sectors. A sector includes user data and overhead data, such as an Error Correction Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16–20 bytes. A large number of pages form a block that includes anywhere from 8 pages, for example, up to 32, 64 or more pages.

Figure 10:
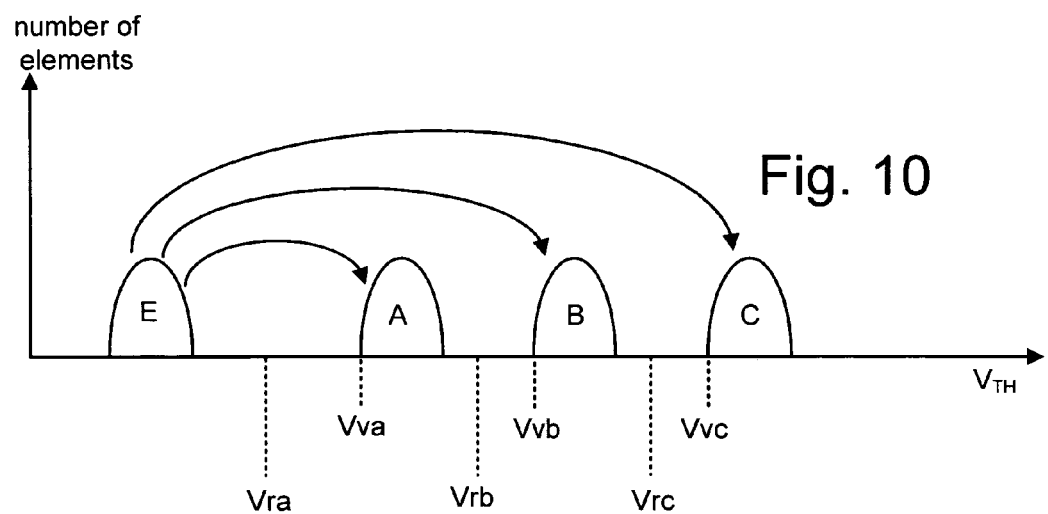
FIG. 10 depicts an example set of threshold voltage distributions in a multi-state device with direct programming from the erased state to a programmed state.

FIG. 10 illustrates threshold voltage distributions for the memory element array when each memory element stores two bits of data. E depicts a first threshold voltage distribution for erased memory elements. A, B and C depict three threshold voltage distributions for programmed memory elements. In one design, the threshold voltages in the E distribution are negative and the threshold voltages in the A, B and C distributions are positive.

Each distinct threshold voltage range corresponds to predetermined values for the set of data bits. The specific relationship between the data programmed into the memory element and the threshold voltage levels of the element depends upon the data encoding scheme adopted for the elements. One example assigns "11" to the threshold voltage range E (state E), "10" to the threshold voltage range A (state A), "00" to the threshold voltage range B (state B) and "01" to the threshold voltage range C (state C). However, in other designs, other schemes are used.

Three read reference voltages, Vra, Vrb and Vrc, are used for reading data from memory elements. By testing whether the threshold voltage of a given memory element is above or below Vra, Vrb and Vrc, the system can determine the state of the memory element. Three verify reference voltages, Vva, Vvb and Vvc are also indicated. When programming memory elements to state A, B or C, the system will test whether those memory elements have a threshold voltage greater than or equal to Vva, Vvb or Vvc, respectively.

In one approach, known as full sequence programming, memory elements can be programmed from the erase state E directly to any of the programmed states A, B or C (as depicted by the curved arrows). For example, a population of memory elements to be programmed may first be erased so that all memory elements in the population are in the erased state E. While some memory elements are being programmed from state E to state A, other memory elements are being programmed from state E to state B and/or from state E to state C.

Figure 11:
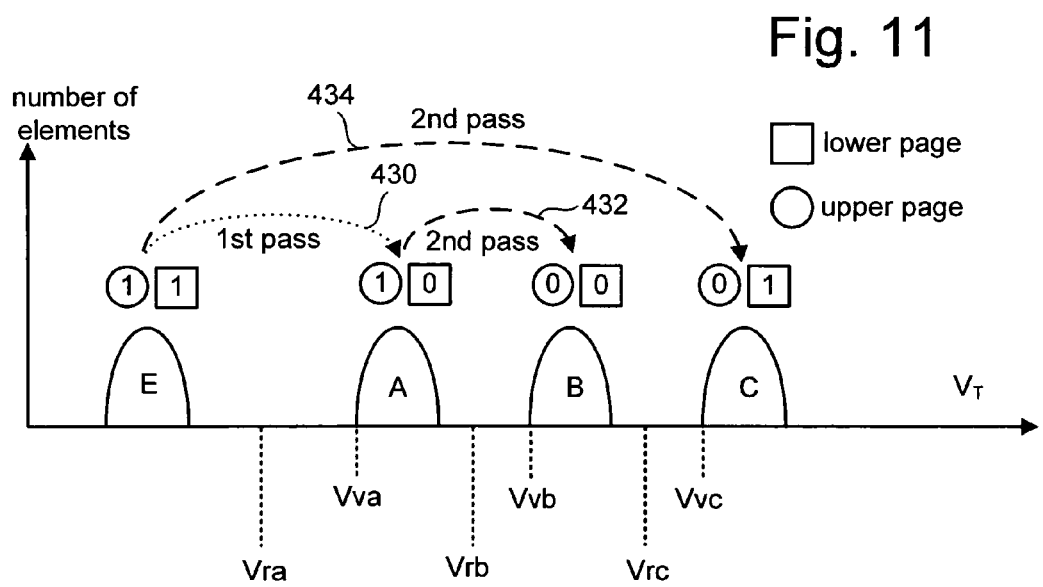
FIG. 11 depicts an example set of threshold voltage distributions in a multi-state device with two-pass programming from the erased state to a programmed state.

FIG. 11 illustrates an example of a two-pass technique of programming a multi-state memory element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the element's threshold voltage level is set according to the bit to be programmed into the lower logical page. If that bit is a logic "1," the threshold voltage is not changed since it is in the appropriate state as a result of having been previously erased. However, if the bit to be programmed is a logic "0," the threshold level of the element is increased to be state A, as shown by arrow 430. That concludes the first programming pass.

In a second programming pass, the element's threshold voltage level is set according to the bit being programmed into the upper logical page. If the upper logical page bit is to store a logic "1," then no programming occurs since the element is in one of the states E or A, depending upon the programming of the lower page bit, both of which carry an upper page bit of "1." If the upper page bit is to be a logic "0," then the threshold voltage is shifted. If the first pass resulted in the element remaining in the erased state E, then, in the second phase, the element is programmed so that the threshold voltage is increased to be within state C, as depicted by arrow 434. If the element had been programmed into state A as a result of the first programming pass, then the memory element is further programmed in the second pass so that the threshold voltage is increased to be within state B, as depicted by arrow 432. The result of the second pass is to program the element into the state designated to store a logic "0" for the upper page without changing the data for the lower page.

In one approach, a system can be set up to perform full sequence writing if enough data is written to fill up two pages. If not enough data is written for two pages, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's memory elements. More details of such an approach are disclosed in U.S. patent Application titled "Pipelined Programming of Non-Volatile Memories Using Early Data," Ser. No. 11/013,125, filed on Dec. 14, 2004 by inventors Sergy A. Gorobets and Yan Li, incorporated herein by reference in its entirety.

Figure 12A:
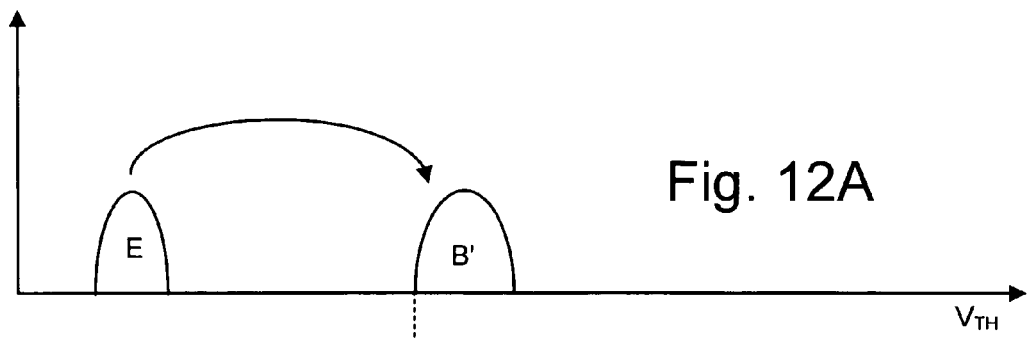
FIGS. 12A–C show various threshold voltage distributions and describe a process for programming non-volatile memory.
Figure 12B:
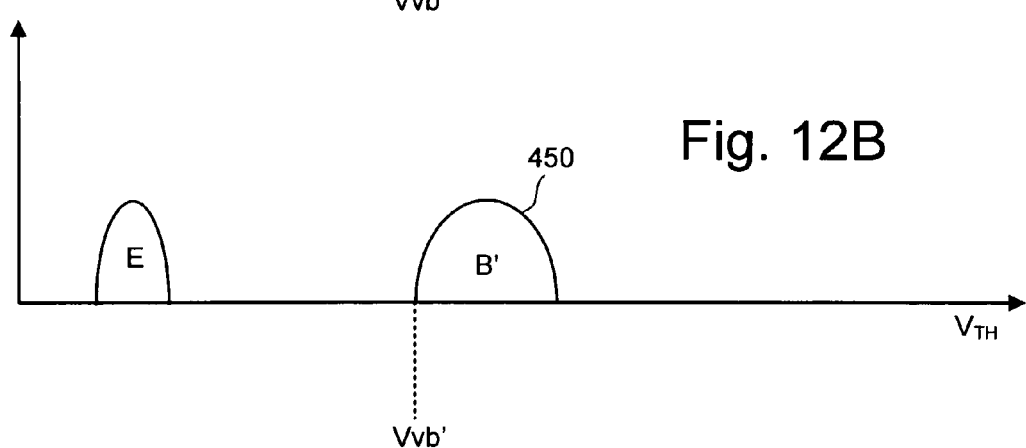
Figure 12C:
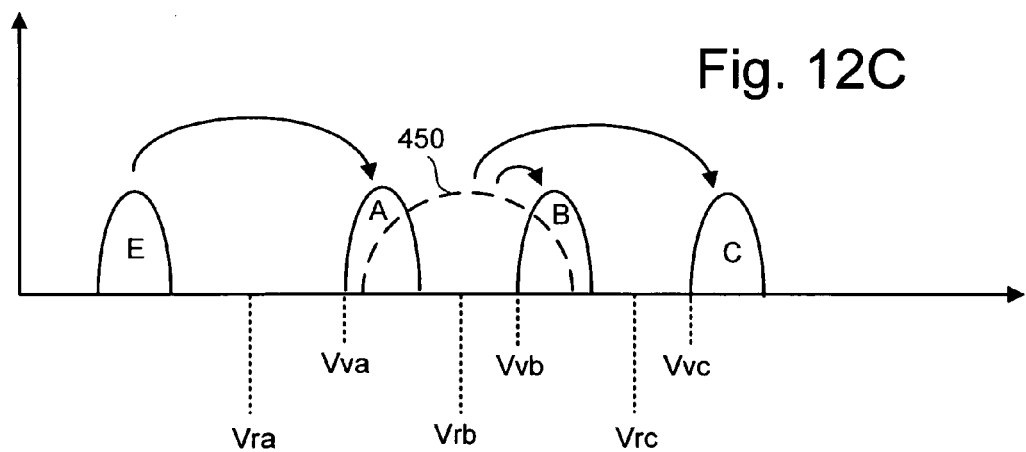

FIGS. 12A–C depict another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. In the first step, the lower page is programmed. If the lower page is to remain data 1, then the memory element state remains at state E. If the data is to be programmed to 0, then the voltage threshold $V_{TH}$ of the memory element is raised such that the memory element is programmed to state B'. FIG. 12A therefore shows the programming of memory elements from state E to state B'. State B' depicted in FIG. 12A represents an interim state B; therefore, the verify point is depicted as Vvb', which is lower than Vvb, depicted in FIG. 12C.

In one design, after a memory element is programmed from state E to state B', its neighbor memory element on an adjacent word line is programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 450 in FIG. 12B. This apparent widening of the threshold voltage distribution will be remedied when programming the upper page.

FIG. 12C depicts the process of programming the upper page. If the memory element is in erased state E and the upper page is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 450 and the upper page data is to remain at 1, the memory element will be programmed to final state B. If the memory element is in state B' with the intermediate threshold voltage distribution 450 and the upper page data is to become data 0, the threshold voltage of the memory element will be raised so that the memory element is in state C. The process depicted by FIGS. 12A–C reduces the effect of floating gate-to-floating gate coupling because only the upper page programming of neighbor memory elements will have an effect on the apparent threshold voltage of a given memory element. An example of an alternate state coding is to move from distribution 450 to state C when the upper page data is a 1, and to move to state B when the upper page data is a 0. Although FIGS. 12A–C provide an example with respect to four data states and two pages of data, the concepts taught can be applied to other implementations with more or less than four states and different than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005.

To reduce the incidence of program disturb for unselected memory elements, it is proposed to adjust a word line sequence in which the memory elements are programmed, to tailor the boosting techniques based on the word line position, and to provide channel pre-charging.

Figure 13:
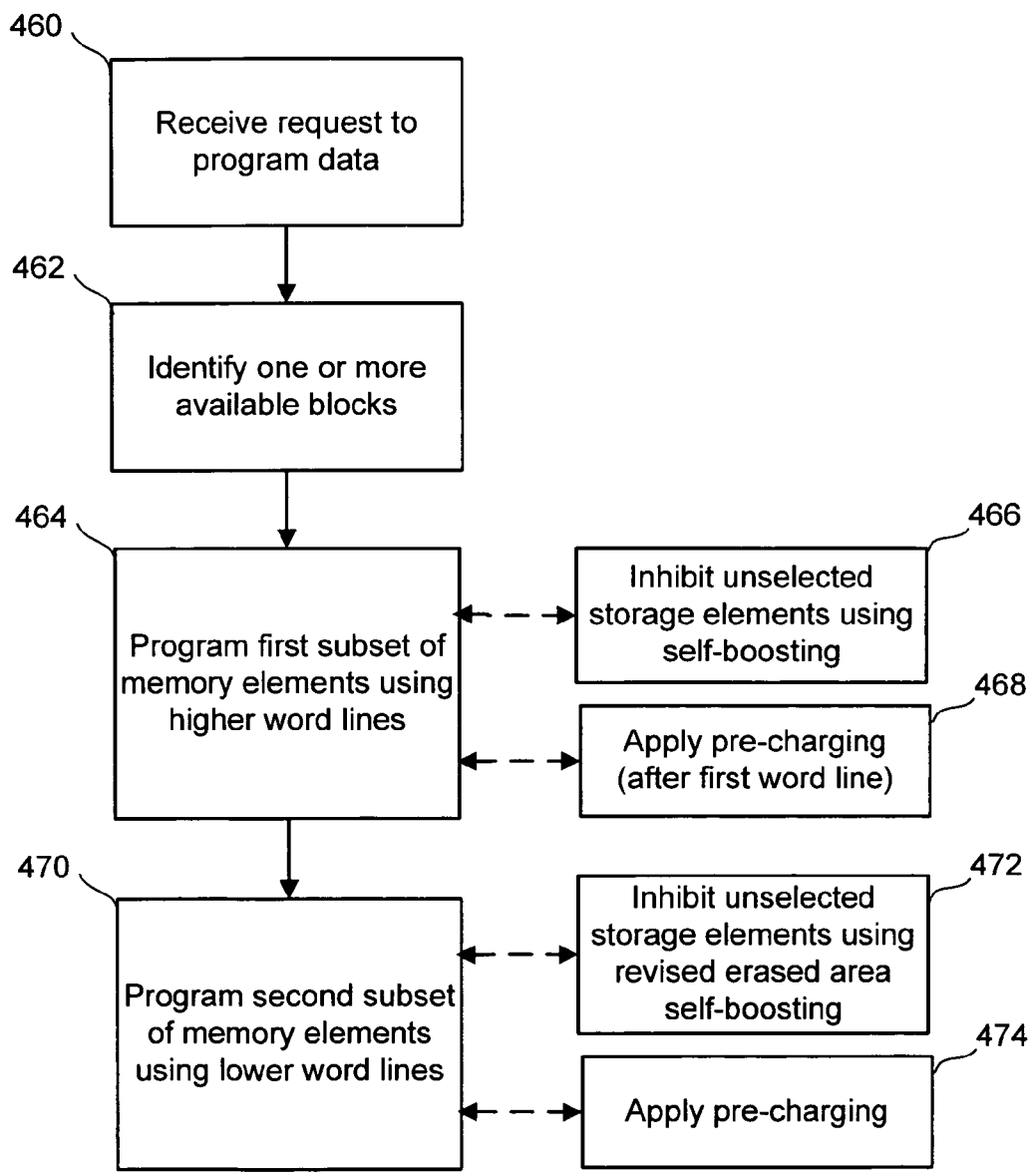
FIG. 13 provides a flow chart describing a process for programming non-volatile storage while reducing the incidence of program disturb.

FIG. 13 provides a flow chart describing a process for programming non-volatile storage while reducing the incidence of program disturb. At step 460, a request to program data is received, such as by one or more managing circuits of a memory device. At step 462, one or more available blocks, pages, sectors and/or other units for storing the data are identified. At step 464, a first subset of memory elements are programmed using a corresponding first subset of word lines, such as the higher word lines. During the programming, the unselected memory elements are inhibited using self-boosting (step 466), in one possible approach. As discussed previously, self-boosting increases the channel boosting potential for unselected memory elements to render the memory elements less susceptible to program disturb. When the last one or more word lines are programmed first, there is no concern that the channel potential for unselected memory elements associated with these word lines will be reduced to the point that program disturb is likely. The technique proposed avoids the conventional problem in which the channel potential decreases for memory elements associated with the higher word lines due to the accumulative effect of the negative charges on the floating gates of the programmed elements of the lower word lines on the inhibited NAND string. Since none of the memory elements associated with the lower word lines have been programmed when the memory elements associated with the higher word lines are programmed, in one embodiment, the accumulative effect is not present. For the embodiments in which some of the memory elements associated with the lower word lines are programmed before the memory elements associated with the higher word lines, those lower word lines should be limited in number to avoid causing program disturb on the memory elements associated with the higher word lines.

Additionally, at step 468, pre-charging, as discussed below in connection with FIG. 18, is applied after the first word line, e.g., the word line that is used before all other word lines in a set of word lines, has been used for programming. Pre-charging is not needed when the first word line is used for programming since, in the inhibited NAND string, there is no previously programmed drain side neighbor memory element which can cut off the channel from the bit line potential. Pre-charging of the inhibited NAND string can be used when the remaining word lines are used for programming.

Subsequently, a process begins for programming the remaining memory elements, e.g., in a second subset of memory elements, using a corresponding second subset of word lines. At step 470, a second subset of word lines such as the lower word lines are used to program the second subset of memory elements. At step 472, unselected storage elements are inhibited using EASB or REASB, in one possible approach. Accordingly, in a further embodiment, self-boosting can be used for the first subset of word lines, while EASB or REASB is used for the remaining word lines. Moreover, EASB and REASB may be used on different ones of the remaining word lines. Additionally, pre-charging, discussed below in connection with FIG. 18, may be used with EASB and/or REASB. Pre-charging is applied at step 474.

Figure 14:
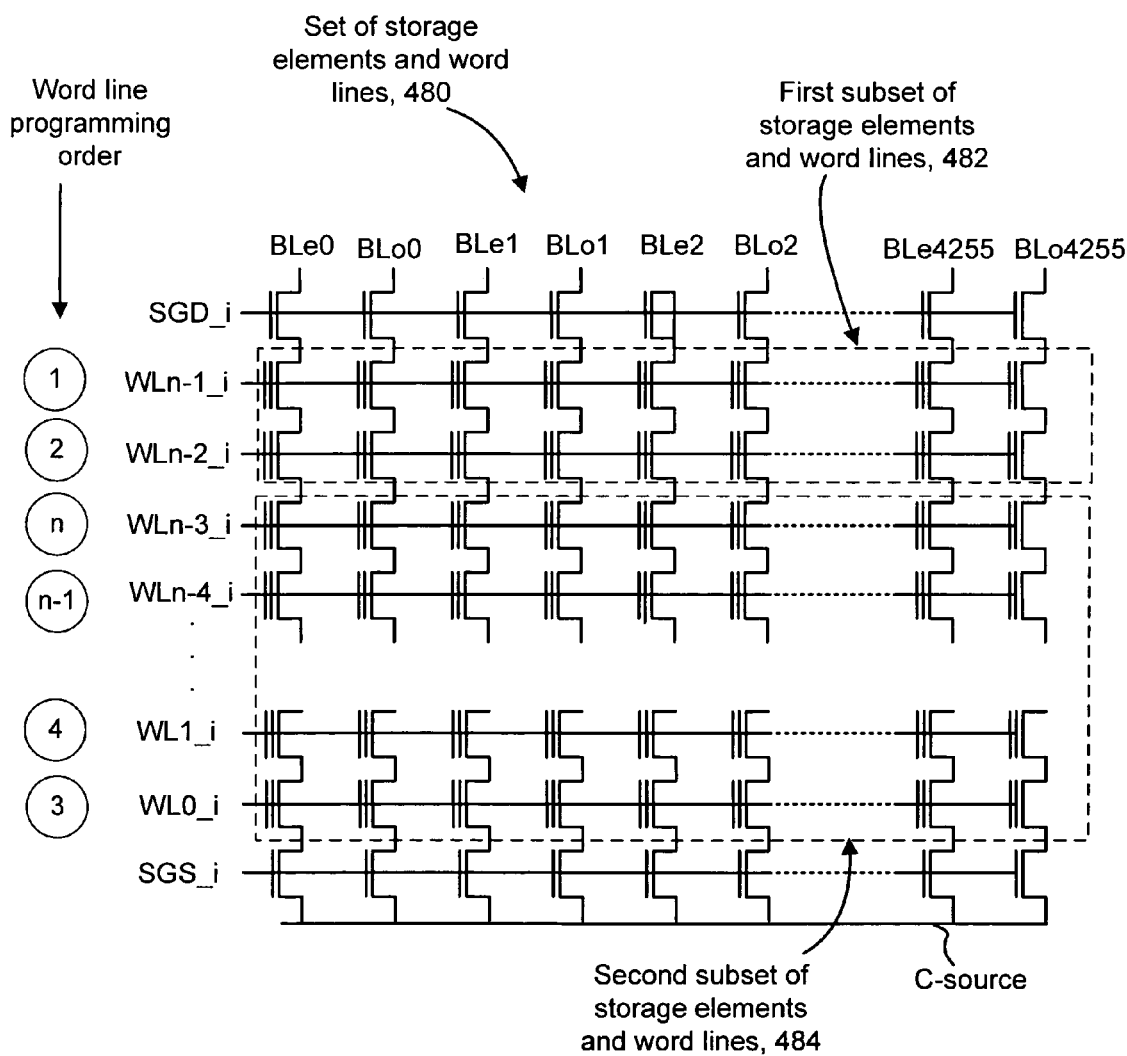
FIG. 14 depicts a word line sequence for programming first and second subsets of non-volatile storage elements in a manner which reduces the incidence of program disturb.

FIG. 14 depicts a word line sequence for programming first and second subsets of non-volatile storage elements in a manner which reduces the incidence of program disturb. The diagram illustrates a set of storage elements and word lines 480, such as from a block of a memory device, analogous to that shown in FIG. 9. A number "n" of word lines extend from one end of the set, at word line WL0, to another end of the set, at word line WLn-1. WL0 may be considered to be at the source or common end of the set of memory elements, while WLn-1 may be considered to be at the drain or bit line end of the set of memory elements, in one embodiment.

In one embodiment, memory elements associated with higher word lines are programmed first. For example, a "last-first" mode (LF mode) may be used where one or more of the higher or last word lines are used for programming before the lower or first word lines. For instance, the higher word lines can be the word lines closest to the drain or bit line side of a set of memory elements, while the lower word lines can be the word lines closest to the source or common side of the set. Typically, the word lines are numbered starting from zero at the source side. For example, with n word lines numbered from WL0 to WLn-1, starting from a first word line at the source side (WL0) and proceeding in a sequence through a number of intermediate word lines to a last word line at the drain side (WLn-1), the predefined order of programming may be: WLn-1, WLn-2, WL0, WL1, ..., WLn-4, WLn-3. For example, with 32 word lines, the order can be: WL31, WL30, WL0–WL29. In this case, the last two word lines are programmed out of sequence with respect to the sequence in which the word lines in the set extend, e.g., the sequence WL0 through WLn-1. The memory elements associated with WLn-1 and WLn-2 make up a first subset of memory elements which are programmed, and the word lines WLn-1 and WLn-2 make up a first subset of word lines which are used for programming, as indicated by the dashed line box 482. Similarly, the memory elements associated with WL0 through WLn-3 make up a second subset of memory elements which are programmed, and the word lines WL0 through WLn-3 make up a second subset of word lines which are used for programming, as indicated by the dashed line box 484.

In another approach, a subset of the lower word lines which are separated from the higher word lines are programmed before the higher word lines, while the higher word lines are programmed before a subset of intermediate word lines which are between the lower and higher word lines, as exemplified by the sequence: WL0–15, WL31, WL30, WL16–29, with 32 word lines, where the subset of lower word lines is WL0–15, the subset of higher word lines is WL31, WL30 and the subset of intermediate word lines is WL16–29. Thus, the higher word lines need not necessarily be used first for programming, but should be programmed before neighboring word lines which are close enough to cause program disturb. In one embodiment, the word line order is chosen so that the word lines which are programmed first are those having memory elements which are most susceptible to program disturb when the word lines are programmed in the conventional sequence, from first to last. Note also that, among the one or more word lines which are used first for programming, the order of programming may start at the word line which is closest to the bit line side of a set of non-volatile elements, such as the drain side in a NAND string, and proceed toward a common side of the set of non-volatile elements, such as the source side in a NAND string, as exemplified by the sequence: WLn-1, WLn-2, or WL31, WL30. This has been found to reduce capacitive coupling between adjacent elements that are programmed at different times.

The number of word lines which are programmed out of sequence can be defined based on the number of non-volatile storage elements on each word line which are expected to experience a defined level of program disturb, e.g., based on a number of fail bits, if the non-volatile storage elements were to be programmed in a word line order which is in the sequence in which the word lines extend in the memory device. For example, with some current devices, the last two word lines experience significantly more fail bits than other word lines. Moreover, as discussed below, the performance of specific memory devices can be measured to determine which word lines which should be included in the first, out of sequence, subset of word lines. Once the determination is made, one or more managing circuits can store data which defines the corresponding word line programming order.

Figure 15:
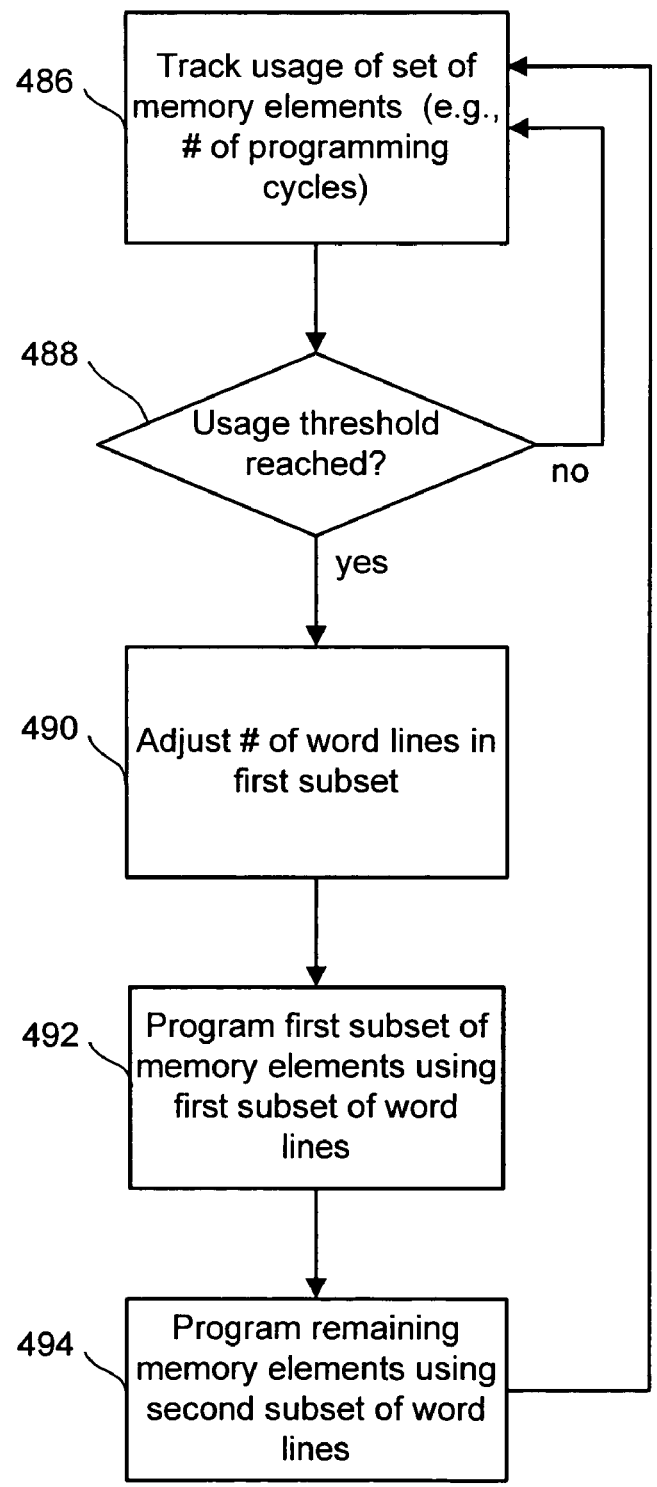
FIG. 15 provides a flow chart describing a process for adjusting a word line order for programming non-volatile storage elements based on a usage of the non-volatile storage elements.

FIG. 15 provides a flow chart describing a process for adjusting a word line order for programming non-volatile storage elements based on a usage of the non-volatile storage elements. For example, it is possible to adjust the number of word lines that are programmed in the out of sequence, first subset of word lines based on the number of programming cycles which the memory device has experienced. For instance, two word lines may be programmed in the first subset for a fresh device, while three word lines are programmed in the first subset for a cycled device. The cycle count (see step 504 of FIG. 16) may be used to determine when to make the adjustment. A table or equation relating the number of programming cycles or other usage metric to the number of word lines to be programmed in the out of sequence, first subset can be developed to implement this technique.

In an example process, at step 486, a usage of a set of memory elements is tracked such as by tracking a number of programming cycles which the memory elements have experienced. The usage may also take into account factors such as operating temperatures and humidity, and the age of the memory device. If a usage threshold is reached (step 488), the number of word lines in the first subset of word lines is adjusted, e.g., increased, at step 490. For example, the number of word lines in the first subset can be set to two word lines for 0–3,000 programming cycles, three word lines for 3,001–6,000 programming cycles, and four word lines for 6,001–10,000 programming cycles. In this example, the thresholds for adjusting the number of word lines are 3,000 and 6,000. At step 492, the first subset of memory elements is programmed using the first subset of word lines, as currently defined based on the usage, and at step 494, the remaining memory elements are programmed using the remaining word lines. The process repeats as subsequent programming cycles are tracked. Although fail bits can be caused by other factors besides program disturb, the proportion of all fail bits which fail due to program disturb is predictable.

Figure 16:
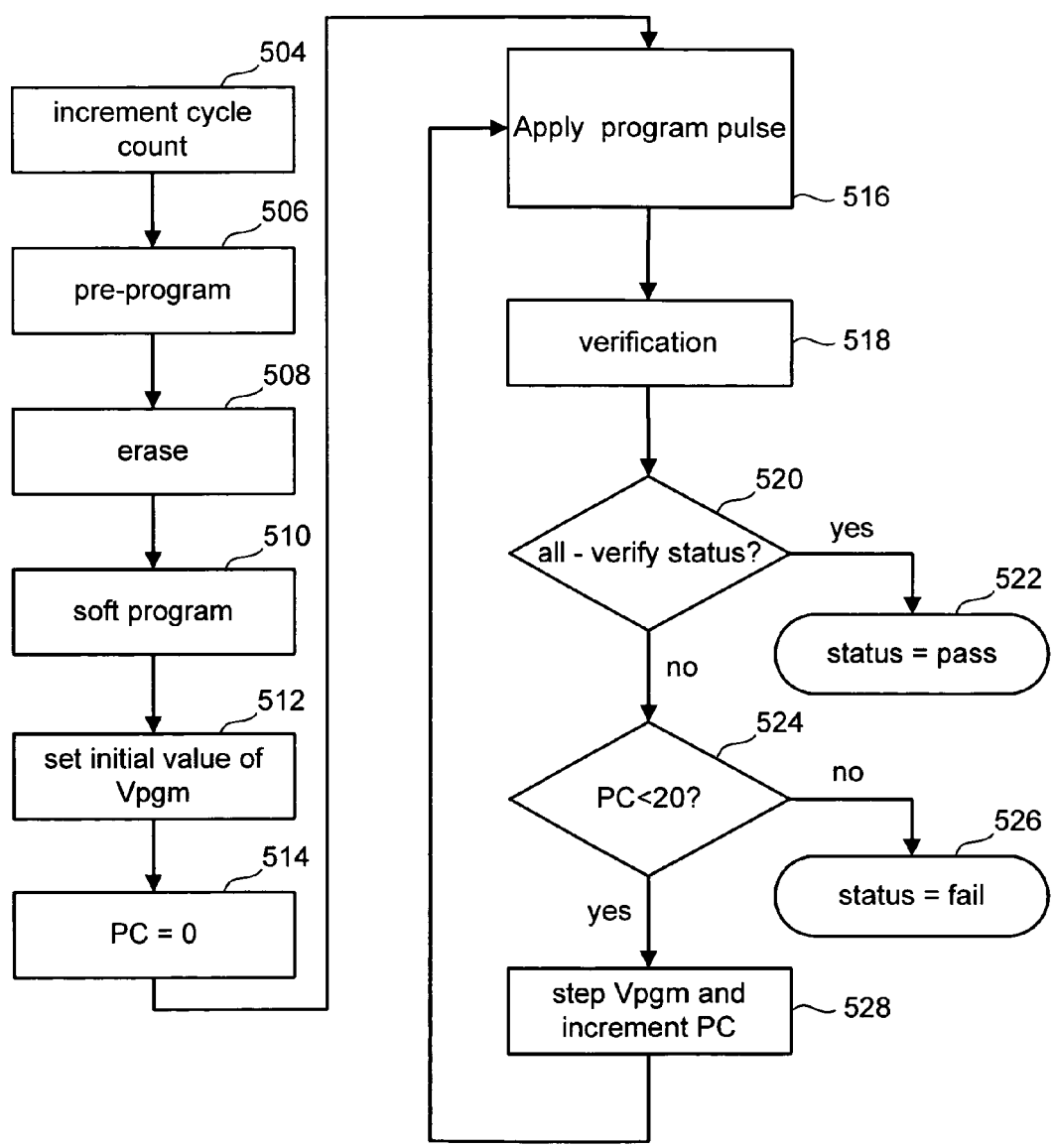
FIG. 16 provides a flow chart describing a process for programming non-volatile storage elements associated with a word line.

FIG. 16 provides a flow chart describing a process for programming non-volatile storage while reducing the incidence of program disturb. The process generally provides details of the programming steps 464 and 470 of FIG. 13, and can be performed in response to receiving a request to program data, as indicated at step 460. Also, as indicated at step 462, the system selects the appropriate portions of memory to program. Referring to FIG. 16, at step 504, the cycle count is incremented. The cycle count, which is a count of the number of programming cycles, can be stored in the flash memory array, the state machine, the controller, or another location, to track the usage of the memory elements, as discussed in connection with FIG. 15, step 486. In one embodiment, the cycle count is stored in a register associated with the state machine. At step 506, the selected portion of memory is optionally pre-programmed, which provides for even wearing of the flash memory. All memory elements in the chosen sector or page are programmed to the same threshold voltage range. At step 508, all the memory elements to be programmed are then erased. For example, step 508 can include moving all memory elements to state E (see FIGS. 10–12). At step 510, a soft programming process addresses the issue that, during the erase process, it is possible that some of the memory elements have their threshold voltages lowered to a value that is below the distribution E (see FIGS. 10–12). The soft programming process applies program voltage pulses to the memory elements so that their threshold voltages will increase to be within threshold voltage distribution E. In step 512, the system sets the magnitude of the initial program pulse, e.g., by properly programming the charge pump. At step 514, the program count PC is initially set to zero.

In step 516, a program pulse is applied to the appropriate word line(s). In step 518, the memory elements on that word line(s) are verified to see if they have reached the target threshold voltage level. If all the memory elements have reached the target threshold voltage level (step 520), then the programming process has completed successfully (status=pass) in step 522. If not all the memory elements have been verified, then it is determined in step 524 whether the program count PC is less than a limit such as twenty. If the program count is not less than twenty, then the programming process has failed (step 526). If the program count is less than twenty, then in step 528, the magnitude of program voltage signal Vpgm is incremented by the step size (e.g., 0.3 V) for the next pulse and the program count PC is incremented. Note that those memory elements that have reached their target threshold voltage are locked out of programming for the remainder of the current programming cycle. After step 528, the process continues at step 516 and the next program pulse is applied. The process is repeated until a pass or fail status has been declared for each of the memory elements.

Figure 17:
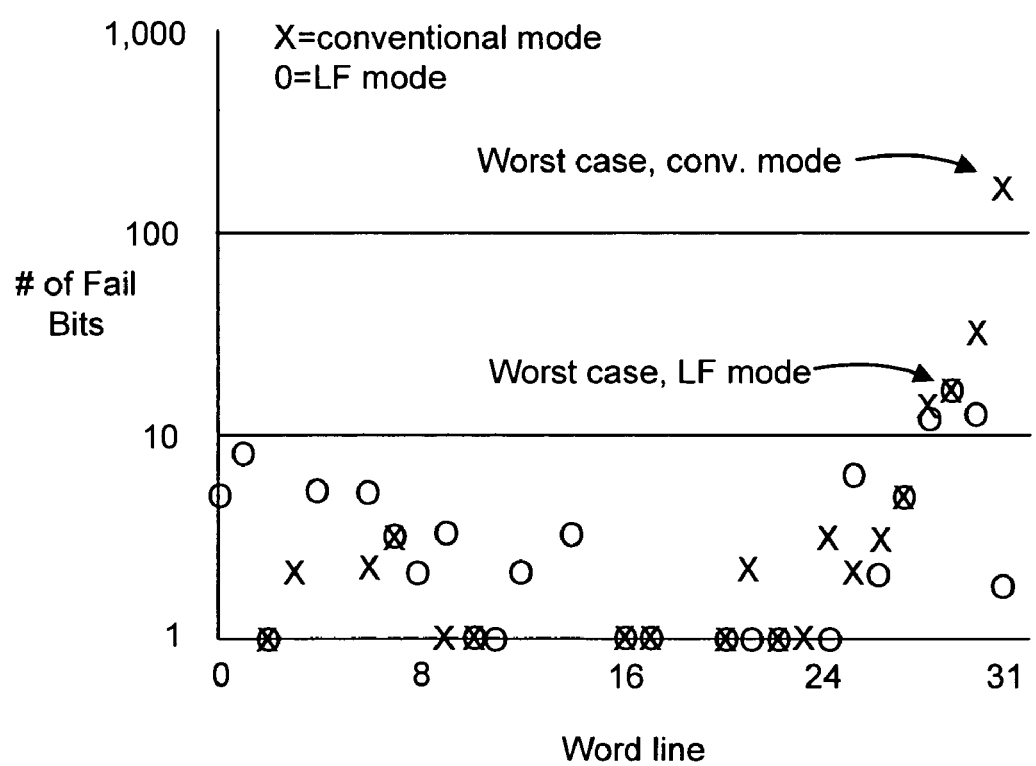
FIG. 17 is a graph showing a reduction in a number of fail bits for higher word lines using a last-first programming mode compared to a conventional programming mode.

FIG. 17 is a graph showing a reduction in a number of fail bits for higher word lines using a last-first programming mode compared to a conventional programming mode. The data was obtained from approximately one billion memory elements of a 90-nm, multi-state, memory device. The word line is identified on the x-axis, where the first word line is closest to the source side of a set of storage elements, and the last word line is closest to the drain side of the set. The number of fail bits is denoted on the y-axis in a logarithmic scale. X's denote data obtained using a conventional word line programming sequence, with revised EASB boosting, while the O's denote data obtained using a last-first (LF) word line programming order, in the order WL31, WL30, WL0-29. Conventional self-boosting is used for the out of sequence word lines, WL30 and WL31, while revised EASB is used for the remaining word lines. Pre-charging is used for all word lines after the first word line. As can be seen by the worst case conditions for the conventional and the LF modes, the LF mode provided herein advantageously reduced the number of fail bits by a factor of about ten. Additionally, the fail bits were distributed relatively uniformly among the word lines.

FIG. 18 depicts a time line showing voltage waveforms for an inhibited NAND string, where pre-charging is used. One issue with the last-first mode provided herein is that, in a NAND string, when programming memory elements on lower word lines, the bit line voltage may not be able to pass through previously-programmed memory elements on the higher word lines. In order to pass the bit line voltage, an optional pre-charging technique, mentioned above in connection with steps 468 and 474 of FIG. 13, can be used. This technique can be designed into the memory chip as a program sub-sequence, for instance. Pre-charging involves charging the channel from the source and/or drain prior to boosting so that, when inhibited, the channel starts out at a higher potential than ground.

Generally, pre-charging can be applied after the memory elements associated with the first word line are programmed. In the time line, the x-axis denotes time and the y-axis denotes waveform voltage level. The x-axis is expanded and contracted in different portions to show relevant details. Pre-charging occurs in the time period between $t_0$ and $t_3$. The source select gate receives a zero or steady state voltage Vss so that it remains off. During the pre-charging, the drain select gate receives a first raised voltage between $t_0$ and $t_3$. The raised voltage is high enough to turn on the gate, allowing the bit line voltage, V bit line, to be applied to the corresponding NAND string between $t_1$ and $t_3$, resulting in a NAND string voltage, V NAND, of Vdd between $t_1$ and $t_3$. The drain select gate voltage drops to Vdd at $t_3$, closing the select gate and isolating the NAND string channel from the bit line so that the boosted channel will not dissipate into the bit line. An intermediate voltage, between Vdd and 0 V, remains in the NAND string between $t_2$ and $t_4$. Since the potential of the selected WL and unselected WL on the drain side have been raised to Vread prior to applying the programming pulse Vpgm between $t_5$ and $t_6$, when programming memory elements on lower word lines, the bit line charge can pass through the previously-programmed memory elements on the higher word lines.

Between $t_4$, and $t_7$, Vpass is applied to the unselected word line on the source side. This voltage couples to the NAND string channel, resulting in a boost voltage, Vboost, in the NAND string channel. Between $t_5$ and $t_6$, the program voltage Vpgm is applied to the selected word line to program the associated memory element in the programmed NAND string. At $t_7$, the boost level in the NAND string drops to about Vdd when the voltage Vpass is removed from the unselected word line on the source side.

FIG. 19 depicts a time line showing voltage waveforms for a programmed NAND string. The time points are the same as in FIG. 18. In the programmed NAND string, the bit line is grounded (V bit line=0) and, consequently, V NAND=0. Specifically, the voltage applied to the drain select gate, Vdd, is now sufficient to turn on the drain select gate so that the string communicates with the bit line. Moreover, since the string is not inhibited, Vpgm, applied between $t_5$ and $t_6$, programs the memory element in the programmed NAND string which is associated with the current word line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
first and second subsets of non-volatile storage elements in a set of non-volatile storage elements;
a plurality of word lines that extend in a sequence from a first word line to a last word line, the plurality of word lines including first and second subsets of word lines; and
one or more managing circuits in communication with the first and second subsets of non-volatile storage elements via the first and second subsets of word lines, respectively, the one or more managing circuits receive a request to program data, and, responsive to the request, program the first subset of non-volatile storage elements using the first subset of word lines, and subsequently, program the second subset of non-volatile storage elements using the second subset of word lines, the first and second subsets of non-volatile storage elements are programmed in a predefined word line sequence that is out of sequence relative to the sequence in which the plurality of word lines extend.

2. The non-volatile storage system of claim 1, wherein:
the non-volatile storage elements comprise flash memory elements.

3. The non-volatile storage system of claim 1, wherein:
at least a portion of the first subset of non-volatile storage elements are programmed by the last word line.

4. The non-volatile storage system of claim 1, wherein:
at least a portion of the first subset of non-volatile storage elements are programmed by the last word line and, subsequently, by a word line adjacent thereto.

5. The non-volatile storage system of claim 1, wherein:
the second subset of non-volatile storage elements are programmed starting from the first word line and proceeding according to the sequence in which the plurality of word lines extend to a word line adjacent to a word line that is used for programming at least a portion of the first subset of non-volatile storage elements.

6. The non-volatile storage system of claim 1, wherein:
the one or more managing circuits program a third subset of non-volatile storage elements in the set following the programming of the second subset of non-volatile storage elements; and
the third subset of non-volatile storage elements are programmed by word lines which are between the first and second subsets of word lines.

7. The non-volatile storage system of claim 1, wherein:
the one or more managing circuits store data which identifies the first subset of word lines based on a determination of which non-volatile storage elements in the set are expected to experience a defined level of fail bits if the non-volatile storage elements in the set were to be programmed in the sequence in which the plurality of word lines extend.

8. The non-volatile storage system of claim 1, wherein:
the set of non-volatile storage elements are arranged in a plurality of NAND strings.

9. The non-volatile storage system of claim 1, wherein:
the first word line is arranged at a source side of the set, and the last word line is arranged at a drain side of the set.

10. The non-volatile storage system of claim 1, wherein:
the one or more managing circuits inhibit unselected non-volatile storage elements in the first subset of non-volatile storage elements using a first inhibit mode to reduce program disturb; and
the one or more managing circuits inhibit unselected non-volatile storage elements in the second subset of non-volatile storage elements using a second inhibit mode, different than the first inhibit mode, to reduce program disturb.

11. The non-volatile storage system of claim 10, wherein:
the first inhibit mode is a self-boosting mode; and
the second inhibit mode is an erased area self-boosting mode.

12. The non-volatile storage system of claim 11, wherein:
in the self-boosting mode, a pass voltage Vpass is applied to one or more unselected word lines; and
in the erased area self-boosting mode, a pass voltage Vpass is applied to one or more unselected word lines on a bit line side of a selected word line and on a common side of the selected word line, other than a word line adjacent to the selected word line on the common side, which receives a steady state voltage Vss, and an inhibit voltage Vdd is applied to a bit line in the set of a non-volatile storage element being inhibited, where the non-volatile storage element being inhibited is on the same word line as a non-volatile storage element that is being programmed.

13. The non-volatile storage system of claim 11, wherein:
the one or more managing circuits charges a channel of a non-volatile storage element which is being inhibited, and on the same word line as a non-volatile storage element that is being programmed, so that the channel starts out at a higher potential than ground when the self boosting mode or the erased area self-boosting mode is used.

14. The non-volatile storage system of claim 10, wherein:
the first inhibit mode is a self-boosting mode; and
the second inhibit mode is a revised erased area self-boosting mode.

15. The non-volatile storage system of claim 14, wherein:
in the self-boosting mode, a pass voltage Vpass is applied to one or more unselected word lines; and
in the revised erased area self-boosting mode, a pass voltage Vpass is applied to one or more unselected word lines on a bit line side of a selected word line and on a common side of the selected word line, other than a first word line adjacent to the selected word line on the common side, which receives a voltage Vdd, and a second word line adjacent to the first word line on the common side, which receives a steady state voltage Vss, and an inhibit voltage Vdd is applied to a bit line in the set of a non-volatile storage element being inhibited, where the non-volatile storage element being inhibited is on the same word line as a non-volatile storage element that is being programmed.

16. The non-volatile storage system of claim 14, wherein:
the one or more managing circuits charges a channel of a non-volatile storage element which is being inhibited, and on the same word line as a non-volatile storage element that is being programmed, so that the channel starts out at a higher potential than ground when the self boosting mode or the revised erased area self-boosting mode is used.

17. A non-volatile storage system, comprising:
first and second subsets of non-volatile storage elements in a set of non-volatile storage elements;
a plurality of word lines that extend in a sequence from a first word line arranged at a common side of the set to a last word line arranged at a bit line side of the set, the plurality of word lines including a first subset of word lines which includes the last word line, and a second subset of word lines which includes the first word line; and one or more managing circuits in communication with the first and second subsets of non-volatile storage elements via the first and second subsets of word lines, respectively, the one or more managing circuits receive a request to program data, and, responsive to the request, program the first subset of non-volatile storage elements using the first subset of word lines, including the last word line, and, subsequently, program the second subset of non-volatile storage elements using the second subset of word lines, including the first word line.

18. The non-volatile storage system of claim 17, wherein: the set of non-volatile storage elements are arranged in a plurality of NAND strings.

19. The non-volatile storage system of claim 17, wherein: the first word line is arranged at a source side of the set, and the last word line is arranged at a drain side of the set.

20. The non-volatile storage system of claim 17, wherein: the one or more managing circuits store data which identifies the first subset of word lines based on a determination of which non-volatile storage elements in the set are expected to experience a defined level of fail bits if the non-volatile storage elements in the set were to be programmed in a word line order starting from the first word line and proceeding, one word line at a time, to the last word line.

21. A non-volatile storage system, comprising:

first and second subsets of non-volatile storage elements in a set of non-volatile storage elements;

a plurality of word lines that extend in a sequence from a first word line to a last word line, the plurality of word lines including a first subset of word lines; and one or more managing circuits in communication with the first subset of non-volatile storage elements via the first subset of word lines, and in communication with other ones of the non-volatile storage elements via other ones of the plurality of word lines, the one or more managing circuits store data which identifies the first subset of word lines based on a determination of which non-volatile storage elements in the set are expected to experience a defined level of fail bits if the non-volatile storage elements in the set were to be programmed in a word line order which is in the sequence in which the plurality of word lines extend;

the one or more managing circuits receive a request to program data, and, responsive to the request, program the first subset of non-volatile storage elements using the first subset of word lines, and subsequently, program the other ones of the non-volatile storage elements using the other ones of the word lines.

22. The non-volatile storage system of claim 21, wherein: the non-volatile storage elements are arranged in a plurality of NAND strings in the set.

23. The non-volatile storage system of claim 21, wherein: the first subset of non-volatile storage elements is arranged at least one of a drain side of the set and a bit line side of the set.

24. A non-volatile storage system, comprising:

a set of non-volatile storage elements;

a plurality of word lines for use in programming the first and second subsets of non-volatile storage elements; and one or more managing circuits for tracking a usage of the set of non-volatile storage elements to identify a first subset of the plurality of word lines associated with a first subset of non-volatile storage elements in the set that are expected to experience a defined level of fail bits if the non-volatile storage elements in the set were to be programmed in a word line order starting from a first word line of the plurality of word lines and proceeding sequentially to a last word line of the plurality of word lines;

the one or more managing circuits receive a request to program data, and, responsive to the request, program the first subset of non-volatile storage elements using the first subset of word lines, and subsequently, program a second subset of non-volatile storage elements in the set using a second subset of the plurality of word lines.

25. The non-volatile storage system of claim 24, wherein: the tracking comprises maintaining a cycle count indicating a number of programming cycles experienced by the set of non-volatile storage elements.

26. The non-volatile storage system of claim 24, wherein: a number of word lines in the first subset of the plurality of word lines varies as the usage varies.

27. A non-volatile storage system, comprising:

first and second subsets of non-volatile storage elements in a set of non-volatile storage elements;

a plurality of word lines for use in programming the first and second subsets of non-volatile storage elements, the plurality of word lines including a first end word line at a first end of the set of non-volatile storage elements and a second end word line at a second end of the set of non-volatile storage elements; and one or more managing circuits in communication with the first and second subsets of non-volatile storage elements via associated word lines, the one or more managing circuits receive a request to program data, and, responsive to the request, program a first subset of the set of non-volatile storage elements starting from the first end word line and finishing at a first, intermediate word line which is between the first end word line and the second end word line and, subsequently program a second subset of the set of non-volatile storage elements starting from the second end word line and finishing at a second, intermediate word line which is between the second end word line and the first, intermediate word line.

28. The non-volatile storage system of claim 27, wherein: the set of non-volatile storage elements are arranged in a plurality of NAND strings.

29. The non-volatile storage system of claim 27, wherein: the first end word line is arranged at a drain side of the set, and the second end word line is arranged at a source side of the set.

30. The non-volatile storage system of claim 27, wherein: the first end word line is arranged at a bit line side of the set, and the second end word line is arranged at a common side of the set.

31. The non-volatile storage system of claim 27, wherein: the one or more managing circuits store data which identifies at least the first, intermediate word line based on a determination of which non-volatile storage elements in the set are expected to experience a defined level of fail bits if the non-volatile storage elements in the set were to be programmed in a word line order starting from the second end word line and proceeding, one word line at a time, to the first end word line.

32. A non-volatile storage system, comprising:
first and second subsets of non-volatile storage elements in a set of non-volatile storage elements;
a plurality of word lines, including first and second subsets of word lines for use in applying voltage waveforms to the first and second subsets, respectively, of non-volatile storage elements, the first subset of word lines including a first end word line at a first end of the set of non-volatile storage elements, and the second subset of word lines including a second end word line at a second end of the set of non-volatile storage elements; and
one or more managing circuits in communication with the first and second subsets of non-volatile storage elements via the first and second subsets of word lines, respectively, the one or more managing circuits receive a request to change a state of the first and second subsets of non-volatile storage elements, and, responsive to the request, apply voltage waveforms to the first subset of non-volatile storage elements starting from the first end word line and finishing at a first, intermediate word line which is between the first end word line and the second end word line and, subsequently apply voltage waveforms to the second subset of non-volatile storage elements starting from the second end word line and finishing at a second, intermediate word line which is between the second end word line and the first, intermediate word line.

33. The non-volatile storage system of claim 32, wherein:
the set of non-volatile storage elements are arranged in a plurality of NAND strings.

34. The non-volatile storage system of claim 32, wherein:
the first end word line is arranged at a drain side of the set, and the second end word line is arranged at a source side of the set.

35. The non-volatile storage system of claim 32, wherein:
the first end word line is arranged at a bit line side of the set, and the second end word line is arranged at a common side of the set.

36. The non-volatile storage system of claim 32, wherein:
the one or more managing circuits store data which identifies at least the first, intermediate word line based on a determination of which non-volatile storage elements in the set are expected to experience a defined level of fail bits if the non-volatile storage elements in the set were to be programmed in a word line order starting from the second end word line and proceeding, one word line at a time, to the first end word line.

* * * * *